United States Patent
Shang et al.

(10) Patent No.: US 12,520,685 B2
(45) Date of Patent: Jan. 6, 2026

(54) DISPLAY SUBSTRATE, PREPARATION METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Haigang Qing, Beijing (CN); Qi Qi, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/700,284

(22) PCT Filed: Jul. 17, 2023

(86) PCT No.: PCT/CN2023/107714
§ 371 (c)(1),
(2) Date: Apr. 11, 2024

(87) PCT Pub. No.: WO2025/015497
PCT Pub. Date: Jan. 23, 2025

(65) Prior Publication Data
US 2025/0228086 A1 Jul. 10, 2025

(51) Int. Cl.
*H10K 59/131* (2023.01)
*G09G 3/3233* (2016.01)
*H10K 59/12* (2023.01)

(52) U.S. Cl.
CPC ......... *H10K 59/131* (2023.02); *G09G 3/3233* (2013.01); *H10K 59/1201* (2023.02);
(Continued)

(58) Field of Classification Search
CPC . H10K 59/131; H10K 59/1201; G09G 3/3233
See application file for complete search history.

(56) References Cited

U.S. PATENT DOCUMENTS 11,127,805 B2 * 9/2021 Kim ................. H10D 86/471
12,051,361 B2 * 7/2024 Xu ........................ G09G 3/32
(Continued)

FOREIGN PATENT DOCUMENTS

CN 111951729 A 11/2020
CN 114038427 A 2/2022
(Continued)

*Primary Examiner* — Sardis F Azongha
(74) *Attorney, Agent, or Firm* — Ling Wu; Stephen Yang; Ling and Yang Intellectual Property

(57) ABSTRACT

Disclosed are a display substrate and a preparation method therefor, and a display apparatus. The display substrate includes a plurality of circuit units, at least one circuit unit includes a pixel drive circuit including at least a compensation transistor of oxide (T2) and a drive transistor of polysilicon (T3), a gate electrode of the compensation transistor (T2) is connected to a compensation scan signal line (24), the compensation scan signal line (24) is configured to control the turn-on and turn-off of the compensation transistor (T2); a first electrode of the compensation transistor (T2) is provided on a side of the compensation scan signal line (24) close to the drive transistor (T3) and is connected to a gate electrode of the drive transistor (T3) through a first connection electrode (51).

18 Claims, 17 Drawing Sheets

(52) U.S. Cl.
CPC ............... *G09G 2300/0426* (2013.01); *G09G 2300/0819* (2013.01); *G09G 2300/0842* (2013.01); *G09G 2300/0861* (2013.01); *G09G 2320/0209* (2013.01); *G09G 2320/0233* (2013.01); *G09G 2320/0247* (2013.01); *G09G 2330/021* (2013.01)

(56) References Cited

U.S. PATENT DOCUMENTS

| | | |
|---|---|---|
| 2016/0181341 A1 | 6/2016 | Lee et al. |
| 2022/0344445 A1 | 10/2022 | Tanaka |
| 2023/0320133 A1* | 10/2023 | Choi ................... H10K 71/00 |
| 2024/0090264 A1* | 3/2024 | Kim ................... H10D 30/6723 |

FOREIGN PATENT DOCUMENTS

| | | |
|---|---|---|
| CN | 114361186 A | 4/2022 |
| CN | 115528083 A | 12/2022 |
| CN | 115705821 A | 2/2023 |
| CN | 115835701 A | 3/2023 |
| WO | 2019192365 A1 | 10/2019 |

* cited by examiner

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2023/107714 having an international filing date of Jul. 17, 2023. The above-identified application is hereby incorporated by reference.

TECHNICAL FIELD

The present disclosure relates to, but is not limited to, the field of display technologies, and particularly to a display substrate and a preparation method therefor, and a display apparatus.

BACKGROUND

An Organic Light Emitting Diode (OLED for short) and a Quantum dot Light Emitting Diode (QLED for short) are active light emitting display devices and have advantages such as self-luminescence, wide viewing angle, high contrast ratio, low power consumption, extremely high response speed, lightness and thinness, flexibility, and low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described herein in detail. The summary is not intended to limit the scope of protection of the claims.

In one aspect, the present disclosure provides a display substrate comprising a plurality of circuit units, at least one circuit unit comprises a pixel drive circuit, the pixel drive circuit comprises at least a compensation transistor of oxide and a drive transistor of polysilicon, a gate electrode of the compensation transistor is connected to a compensation scan signal line, the compensation scan signal line is configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode.

In an exemplary embodiment, an orthographic projection of the first connection electrode on the plane of the display substrate and an orthographic projection of the compensation scan signal line on the plane of the display substrate do not overlap.

In an exemplary embodiment, the compensation transistor includes at least a compensation active layer, and the first connection electrode and the compensation active layer are both in a shape of a strip extending toward a direction of the drive transistor, and an extension length of the first connection electrode is less than an extension length of the compensation active layer.

In an exemplary embodiment, the second connection electrode comprises at least a first sub-electrode and a second sub-electrode, a first terminal of the first sub-electrode is connected to the second electrode of the drive transistor, a second terminal of the first sub-electrode extends toward a direction away from the drive transistor, a first terminal of the second sub-electrode is connected to the first sub-electrode, a second terminal of the second sub-electrode, after extending toward a direction of the compensation transistor, is connected to a second electrode of the compensation transistor, the first connection electrode is in a shape of a strip extending toward a direction of the drive transistor, and an extension length of the first sub-electrode is less than an extension length of the first sub-electrode.

In an exemplary embodiment, the at least one circuit unit further includes a first power supply line connected to the pixel drive circuit, the first power supply line is configured to provide a first power supply signal to the pixel drive circuit, an orthographic projection of the first power supply line on the plane of the display substrate at least partially overlaps an orthographic projection of the first connection electrode on the plane of the display substrate.

In an exemplary embodiment, the compensation transistor includes at least a compensation active layer, and an orthographic projection of the first power supply line on the plane of the display substrate at least partially overlaps an orthographic projection of the compensation active layer on the plane of the display substrate.

In an exemplary embodiment, the pixel drive circuit further includes a data writing transistor of polysilicon, a gate electrode of the data writing transistor is connected to the first scan signal line, a first electrode of the data writing transistor is connected to a data signal line, and a second electrode of the data writing transistor is connected to a first electrode of the drive transistor; the first electrode of the data writing transistor is disposed on a side of the compensation scan signal line away from the drive transistor, alternatively, the first electrode of the data writing transistor is disposed on a side of the compensation scan signal line close to the drive transistor.

In an exemplary embodiment, the first scan signal line is disposed on a side of the compensation scan signal line away from the drive transistor.

In an exemplary embodiment, an orthographic projection of the first connection electrode on the plane of the display substrate and an orthographic projection of the first scan signal line on the plane of the display substrate do not overlap.

In an exemplary embodiment, the compensation scan signal line is disposed on a side of the first scan signal line away from the drive transistor.

In an exemplary embodiment, an orthographic projection of the first connection electrode on the plane of the display substrate overlaps at least partially an orthographic projection of the first scan signal line on the plane of the display substrate.

In an exemplary embodiment, the pixel drive circuit further comprises a first initialization transistor and a second initialization transistor of polysilicon; a gate electrode of the first initialization transistor is connected to a third scan signal line, a first electrode of the first initialization transistor is connected to the first initial signal line, and a second electrode of the first initialization transistor is connected to a second electrode of the drive transistor; a gate electrode of the second initialization transistor is connected with a second scan signal line, a first electrode of the second initialization transistor is connected with a second initial signal line, and a second electrode of the second initialization transistor is connected with an anode of a light emitting device; an orthographic projection of the second initial signal line on the plane of the display substrate at least partially overlaps an orthographic projection of the second scan signal line on the plane of the display substrate.

In an exemplary embodiment, the pixel drive circuit further comprises a third initialization transistor of polysilicon, a gate electrode of the third initialization transistor is connected to the second scan signal line, a first electrode of the third initialization transistor is connected to a third initial signal line, and a second electrode of the third initialization transistor is connected to the first electrode of the drive transistor; an orthographic projection of the third initial signal line on the plane of the display substrate at least partially overlaps an orthographic projection of the third scan signal line on the plane of the display substrate.

In an exemplary embodiment, on a plane perpendicular to the display substrate, the display substrate includes a plurality of conductive layers sequentially disposed on a base substrate, the first initial signal line and the second initial signal line are disposed in different conductive layers, and the second initial signal line and the third initial signal line are disposed in a same conductive layer.

In another aspect, the present disclosure further provides a display apparatus, including the display substrate described above.

In another aspect, the present disclosure further provides a preparation method for a display substrate including a plurality of circuit units, the method includes:

Forming a pixel drive circuit in at least one circuit unit, the pixel drive circuit includes at least a compensation transistor of oxide and a drive transistor of polysilicon, a gate electrode of the compensation transistor is connected to a compensation scan signal line configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode.

Other aspects of the present disclosure may be comprehended after the drawings and the detailed descriptions are read and understood.

BRIEF DESCRIPTION OF DRAWINGS

Accompany drawings are used to provide further understanding of technical solution of the present disclosure, and form a part of the description. The accompany drawings and embodiments of the present disclosure are adopted to explain the technical solution of the present disclosure, and do not form limitations on the technical solution of the present disclosure.

Figure 1:
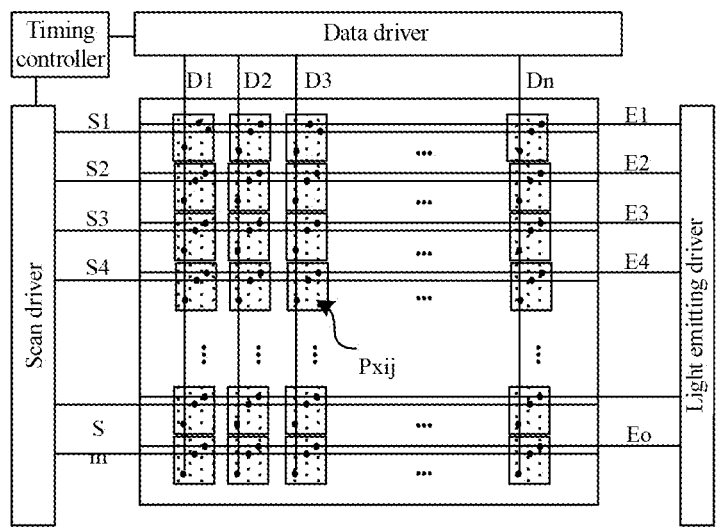
FIG. 1 is a schematic diagram of a structure of a display apparatus.

Reference signs are described as follows.

| | | |
|---|---|---|
| 11-First active layer; | 12-Second active layer; | 13-Third active layer; |
| 14-Fourth active layer; | 15-Fifth active layer; | 16-Sixth active layer; |
| 17-Seventh active layer; | 18- eighth active layer; | 21-First scan signal line; |
| 22-Second scan signal line | 23-third scan signal line; | 24-fourth scan signal line; |
| 25-light emitting signal line; | 26-first electrode plate; | 31-first initial signal line; |
| 32-shielding line; | 33-second electrode plate; | 34-opening; |
| 35-Electrode plate connection strip; | 42-second initial signal line; | 43-Third initial signal line; |
| 51-First connection electrode; | 52-Second connection electrode; | 53-Third connection electrode; |
| 54-fourth connection electrode; | 55-fifth connection electrode; | 56-sixth connection electrode; |
| 57-seventh connection electrode; | 58-eighth connection electrode; | 59-ninth connection electrode; |
| 61-First power supply line; | 62-Data signal line; | 63-anode connection electrode; |
| 91-First shielding electrode line; | 92-Second shielding electrode line; | 93-Shielding electrode; |
| 101-Base substrate; | 102-Drive circuit layer; | 103-Light emitting structure layer; |
| 104-encapsulation structure layer. | | |

DETAILED DESCRIPTION

To make the objectives, technical solutions, and advantages of the present disclosure clearer, the embodiments of the present disclosure will be described in detail below in with reference to the accompany drawings. It is to be noted that the embodiments may be implemented in various forms. Those of ordinary skills in the art can easily understand such a fact that embodiments and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflict.

Scales of the drawings in the present disclosure may be used as a reference in actual processes, but are not limited thereto. For example, a width-length ratio of a channel, a thickness and spacing of various film layers, and a width and spacing of various signal lines may be adjusted according to actual needs. A quantity of pixels in a display substrate and a quantity of sub-pixels in each pixel are not limited to numbers shown in the drawings. The drawings described in the present disclosure are schematic structural diagrams only, and one embodiment of the present disclosure is not limited to shapes, numerical values, or the like shown in the drawings.

Ordinal numerals "first", "second", "third", etc., in the specification are set not to form limits in numbers but only to avoid confusion between composition elements.

In the specification, for convenience, expressions "central", "above", "below", "front", "back", "vertical", "horizontal", "top", "bottom", "inside", "outside", etc., indicating orientation or positional relationships are used to illustrate positional relationships between the composition elements with reference to the drawings, not to indicate or imply that involved devices or elements are required to have specific orientations and be structured and operated with the specific orientations but only to easily and simply describe the present specification, and thus should not be understood as limitations on the present disclosure. The positional relationships between the composition elements may be changed as appropriate according to a direction according to which each composition element is described. Therefore, appropriate replacements based on situations are allowed, which is not limited to the expressions in the specification.

In the specification, unless otherwise specified and defined, terms "mounting", "mutual connection", and "connection" should be understood in a broad sense. For example, a connection may be fixed connection, or detachable connection, or integral connection; it may be mechanical connection or electrical connection; it may be direct connection, or indirect connection through an intermediate, or internal communication between two elements. Those of ordinary skills in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. It is to be noted that in the specification, the channel region refers to a region through which a current mainly flows.

In the specification, a first electrode may be a drain electrode, and a second electrode may be a source electrode. Or, the first electrode may be a source electrode, and the second electrode may be a drain electrode. In cases that transistors with opposite polarities are used, or a current direction changes during operation of a circuit, or the like, functions of the "source electrode" and the "drain electrode" are sometimes interchangeable. Therefore, the "source electrode" and the "drain electrode", as well as the "source terminal" and the "drain terminal", are interchangeable in the specification.

In the specification, "electrical connection" includes connection of composition elements through an element with a certain electrical action. An "element with a certain electrical action" is not particularly limited as long as electric signals between the connected composition elements may be sent and received. Examples of the "element with the certain electrical action" not only include an electrode and a line, but also include a switch element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within a range of process and measurement errors are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting unit, the circuit unit may include at least a pixel drive circuit connected to a scan signal line, a light emitting signal line and a data signal line, respectively, the light emitting unit may include a light emitting device connected to the pixel drive circuit of the circuit unit. In an exemplary embodiment, the timing controller may provide a grayscale value and a control signal suitable for a specification of the data signal driver to the data signal driver, may provide a clock signal, a scan start signal, etc. suitable for a specification of the scan driver to the scan driver, and may provide a clock signal, an emission stop signal, etc. suitable for a specification of the light emitting driver to the light emitting driver. The data driver may generate data voltages to be provided to the data signal lines DATA1, D2, D3, . . . , and Dn using the grayscale value and the control signal that are received from the timing controller. For example, the data driver may sample the grayscale value using the clock signal and apply a data voltage corresponding to the grayscale value to the data signal lines DATA1 to Dn by taking a pixel row as a unit, wherein n may be a natural number. The scan driver may generate a scan signals to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register and may generate a scan signal in a manner in which a scan start signal provided in a form of an on-level pulse is transmitted to a next-stage circuit sequentially under control of the clock signal, wherein m may be a natural number. The light emitting driver may receive a clock signal, an emission stop signal, etc., from the timing controller to generate an emission signal to be provided to the light emitting signal lines EM1, E2, E3, . . . , and Eo. For example, the light emitting driver may sequentially provide an emission signal with an off-level pulse to the light emitting signal lines EM1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number. In an exemplary embodiment, the pixel array may be disposed on the display substrate.

Figure 2:
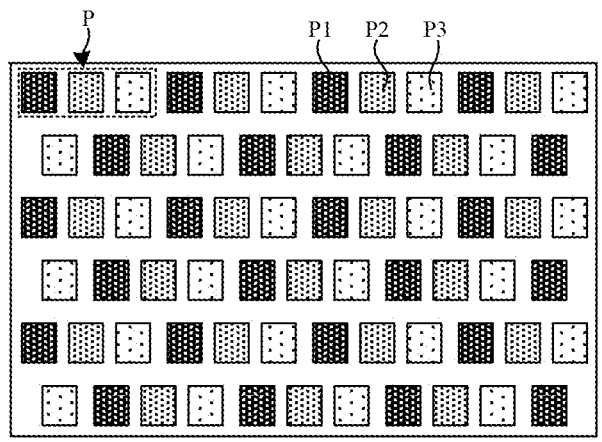
FIG. 2 is a schematic diagram of a planar structure of a display substrate.

FIG. 2 is a schematic diagram of a planar structure of a display substrate. As shown in FIG. 2, the display substrate may include a plurality of pixel units P arranged in a matrix. At least one pixel unit P may include a first sub-pixel P1 emitting light of a first color, a second sub-pixel P2 emitting light of a second color, and a third sub-pixel P3 emitting light of a third color. Each sub-pixel may include a circuit unit and a light emitting unit, wherein the circuit unit may at least include a pixel drive circuit, the pixel drive circuit is connected with a scan signal line, a data signal line, and a light emitting signal line, respectively, and is configured to receive a data voltage transmitted by the data signal line and output a corresponding current to the light emitting unit under control of the scan signal line and the light emitting signal line. A light emitting unit in each sub-pixel is connected with a pixel drive circuit of the sub-pixel where the light emitting unit is located, and is configured to emit light with corresponding brightness in response to a current output by the pixel drive circuit of the sub-pixel where the light emitting unit is located.

In an exemplary embodiment, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary embodiment, a sub-pixel may be in a shape of a rectangle, a rhombus, a pentagon, or a hexagon. Three sub-pixels may be arranged in a manner to stand side by side horizontally, in a manner to stand side by side vertically, or in a manner like a Chinese character "ve", etc., which is not limited here in the present disclosure.

Figure 3:
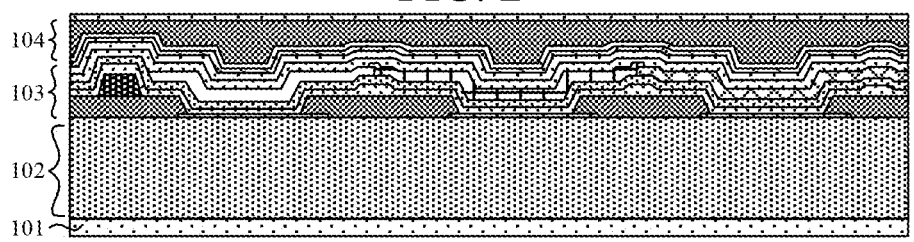
FIG. 3 is a schematic diagram of a sectional structure of a display substrate.

FIG. 3 is a schematic diagram of a sectional structure of a display substrate, illustrating a structure of three sub-pixels in the display region. As shown in FIG. 3, on a plane perpendicular to the display substrate, the display substrate may include a drive circuit layer 102 arranged on a base substrate 101, a light emitting structure layer 103 arranged at a side of the drive circuit layer 102 away from the base substrate 101, and an encapsulation structure layer 104 arranged at a side of the light emitting structure layer 103 away from the base substrate 101. In some possible embodiments, the display substrate may include another film layer, such as a touch structure layer, which is not limited here in the present disclosure.

In an exemplary embodiment, the base substrate 101 may be a flexible base substrate, or may be a rigid base substrate. The drive circuit layer 102 may include a plurality of circuit units, each of which may at least include a pixel drive circuit formed by a plurality of transistors and storage capacitors. The light emitting structure layer 103 may include a plurality of light emitting units, and each light emitting unit may at least include an anode, an organic emitting layer, and a cathode. The anode is connected with a pixel drive circuit. The organic emitting layer is connected with the anode. The cathode is connected with the organic emitting layer. The organic emitting layer emits light of a corresponding color under drive of the anode and the cathode. The encapsulation layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer to form a laminated structure of an inorganic material/an organic material/an inorganic material and ensure that external water vapor cannot enter the light emitting structure layer 103.

Figure 4:
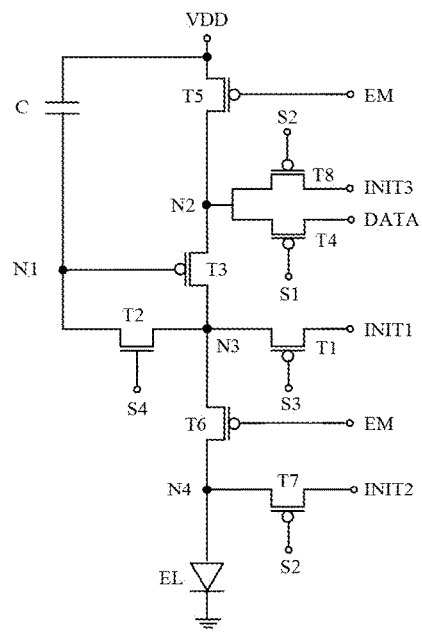
FIG. 4 is a schematic diagram of an equivalent circuit of a pixel drive circuit.

FIG. 4 is a schematic diagram of an equivalent circuit of a pixel drive circuit. In an exemplary embodiment, the pixel drive circuit may have a structure of 3T1C, 4T1C, 5T1C, 5T2C, 6T1C, 7T1C, or 8T1C. As shown in FIG. 4, the pixel drive circuit may include eight transistors (a first transistor T1 to an eighth transistor T8) and one storage capacitor C, and the pixel drive circuit is connected to 10 signal lines (a first scan signal line S1, a second scan signal line S2, a third scan signal line S3, a fourth scan signal line S4, a light emitting signal line EM, a first initial signal line INIT1, a second initial signal line INIT2, a third initial signal line INIT3, a data signal line DATA and a first power supply line VDD), respectively.

In an exemplary embodiment, the pixel drive circuit may include a first node N1, a second node N2, a third node N3 and a fourth node N4. The first node N1 is respectively connected to a first electrode of the second transistor T2, a gate electrode of the third transistor T3 and a first terminal of the storage capacitor C, the second node N2 is respectively connected to a first electrode of the third transistor T3, a second electrode of the fourth transistor T4, a second electrode of the fifth transistor T5 and a second electrode of the eighth transistor T8, the third node N3 is respectively connected to a second electrode of the first transistor T1, a second electrode of the second transistor T2, a second electrode of the third transistor T3 and a first electrode of the sixth transistor T6, the fourth node N4 is respectively connected to a second electrode of the sixth transistor T6 and a second electrode of the seventh transistor T7, and the fourth node N4 is also connected to an anode of a light emitting device EL.

In an exemplary embodiment, the first terminal of the storage capacitor C is connected with the first node N1, and a second terminal of the storage capacitor C is connected with the first power supply line VDD.

In an exemplary embodiment, the first transistor T1 may be referred to as a first initialization transistor, a gate electrode of the first transistor T1 is connected to the third scan signal line S3, a first electrode of the first transistor T1 is connected to the first initial signal line INIT1, and a second electrode of the first transistor T1 is connected to the third node N3. The second transistor T2 may be referred to as a compensation transistor, a gate electrode of the second transistor T2 is connected to the fourth scan signal line S4, a first electrode of the second transistor T2 is connected to the first node N1, and a second electrode of the second transistor T2 is connected to the third node N3. The third transistor T3 may be referred to as a drive transistor, a gate electrode of the third transistor T3 is connected to the first node N1, i.e., a gate electrode of the third transistor T3 is connected to a first terminal of the storage capacitor C, a first electrode of the third transistor T3 is connected to the second node N2, and a second electrode of the third transistor T3 is connected to the third node N3. The fourth transistor T4 may be referred to as a data writing transistor, a gate electrode of the fourth transistor T4 is connected to the first scan signal line S1, a first electrode of the fourth transistor T4 is connected to the data signal line DATA, and a second electrode of the fourth transistor T4 is connected to the second node N2. The fifth transistor T5 may be referred to as a first light emitting control transistor, a gate electrode of the fifth transistor T5 is connected to the light emitting signal line EM, a first electrode of the fifth transistor T5 is connected to the first power supply line VDD, and a second electrode of the fifth transistor T5 is connected to the second node N2. The sixth transistor T6 may be referred to as a second light emitting control transistor, a gate electrode of the sixth transistor T6 is connected to the light emitting signal line EM, a first electrode of the sixth transistor T6 is connected to the third node N3, and a second electrode of the sixth transistor T6 is connected to the fourth node N4. The seventh transistor T7 may be referred to as a second initialization transistor, a gate electrode of the seventh transistor T7 is connected to the second scan signal line S2, a first electrode of the seventh transistor T7 is connected to the second initial signal line INIT2, and a second electrode of the seventh transistor T7 is connected to the fourth node N4. The eighth transistor T8 may be referred to as a third initialization transistor, a gate electrode of the eighth transistor T8 is connected to the second scan signal line S2, a first electrode of the eighth transistor T8 is connected to the third initial signal line INIT3, and a second electrode of the eighth transistor T8 is connected to the second node N2.

In an exemplary embodiment, the light emitting device EL may be an OLED including an anode (first electrode), an organic emitting layer, and a cathode (second electrode) that are stacked, or may be a QLED including an anode (first electrode), a quantum dot emitting layer, and a cathode (second electrode) that are stacked.

In an exemplary embodiment, a first electrode of the light emitting device EL is connected to the fourth node N4, and a second electrode of the light emitting device EL is connected to a second power supply line VSS, the signal of the second power supply line VSS is a continuously supplied low-level signal, and the signal of the first power supply line VDD is a continuously supplied high-level signal.

In an exemplary embodiment, the first transistor T1 to the eighth transistor T8 may be P-type transistors or N-type transistors. Use of a same type of transistors in a pixel drive circuit may simplify a process flow, reduce a process difficulty of a display panel, and improve a product yield. In some possible implementations, the first transistor T1 to the eighth transistor T8 may include P-type transistors and N-type transistors.

In an exemplary embodiment, the first transistor T1 to the eighth transistor T8 may employ a low temperature poly-silicon transistor, or may employ an oxide transistor, or may employ both of the low temperature poly-silicon transistor and the metal oxide transistor. Low Temperature Poly-Silicon (LTPS for short) is adopted for an active layer of a low temperature polysilicon transistor and a metal oxide semiconductor (Oxide) is adopted for an active layer of a metal oxide transistor. A low temperature polysilicon transistor has advantages such as a high migration rate and fast charging, and an oxide transistor has advantages such as a low drain current. The low temperature polysilicon transistor and the metal oxide transistor are integrated on one display substrate to form a Low Temperature Polycrystalline Oxide (LTPO for short) display substrate, such that advantages of the low temperature polysilicon transistor and the metal oxide transistor may be utilized, low-frequency drive may be achieved, power consumption may be reduced, and display quality may be improved.

In an exemplary embodiment, the second transistor T2 may be a metal oxide transistor, and the first transistor T1, the third transistor T3 to the eighth transistor T8 may be low-temperature polysilicon transistors.

In an exemplary embodiment, the working process of the pixel drive circuit shown in FIG. 4 may include the first stage to the sixth stage.

A first stage is referred to as a reset stage of a second node N2 and fourth node N4. The signal of the second scan signal line S2 is a low-level signal, and the signals of the first scan signal line S1, the third scan signal line S3, the fourth scan signal line S4 and the light emitting signal line EM are high-level signals.

The signal of the second scan signal line S2 is a low-level signal, so that the seventh transistor T7 and the eighth transistor T8 are turned on, the signal of the second initial signal line INIT2 is provided to the fourth node N4, to initialize (reset) the first electrode of the light emitting device EL, and clear an original charge in the first electrode of the light emitting device EL, so that the potential of the fourth node N4 is Vinit2. The signal of the third initial signal line INIT3 is provided to the second node N2, to initialize (reset) the second node N2, and clear an original charge in the second node N2, so that the potential of the second node N2 is Vinit3. In this stage, the third transistor T3 is turned on. The signal of the fourth scan signal line S4 is a high-level signal, and the second transistor T2 is turned on. The signal of the second node N2 is provided to the first node N1 and the third node N3, the first node N1 and the third node N3 are initialized, signals of the first scan signal line S1, the third scan signal line S3 and the light emitting signal line EM are high-level signals, and the first transistor T1, the fourth transistor T4, the fifth transistor T5 and the sixth transistor T6 are turned off.

A second stage is referred to as a reset stage for the first node N1. The signal of the third scan signal line S3 is a low-level signal, and the signals of the first scan signal line S1, the second scan signal line S2, the fourth scan signal line S4 and the light emitting signal line EM are high-level signals.

The signal of the third scan signal line S3 is changed to a low-level signal, so that the first transistor T1 is turned on. Because the signal of the fourth scan signal line S4 is a high-level signal in this stage and the second transistor T2 is turned on, the signal of the first initial signal line INIT1 is provided to the first node N1 through the third node N3, to reset the first node N1 again, and the potential of the first node N1 is Vinit1. The signals of the first scan signal line S1, the second scan signal line S2 and the light emitting signal line EM are high-level signals, and the fourth transistor T4, the fifth transistor T5, the sixth transistor T6, the seventh transistor T7 and the eighth transistor T8 are turned off.

The third stage is referred to as a data writing stage or a threshold compensation stage. The signal of the first scan signal line S1 is a low-level signal, and the signals of the second scan signal line S2, the third scan signal line S3, the fourth scan signal line S4 and the light emitting signal line EM are high-level signals.

The signal of the first scan signal line S1 is a low-level signal to turn on the fourth transistor T4. Because the third transistor T3 is continuously turned on in this stage and the signal of the fourth scan signal line S4 is a high-level signal to turn on the second transistor T2, the data voltage output by the data signal line DATA is provided to the first node N1 through the turned-on fourth transistor T4, the second node N2, the turned-on third transistor T3, the third node N3 and the turned-on second transistor T2, and the capacitor C is charged with a difference between the data voltage output by the data signal line DATA and the threshold voltage of the third transistor T3. The voltage of the first node N1 is Vd−|Vth|, Vd is the data voltage output by the data signal line, Vth is the threshold voltage of the third transistor T3, the signals of the second scan signal line S2, the third scan signal line S3 and the light emitting signal line EM are high-level signals, and the first transistor T1, the fifth transistor T5, the sixth transistor T6, the seventh transistor T7 and the eighth transistor T8 are turned off.

A fourth stage is referred to as continuous compensation stage. The signals of the first scan signal line S1, the second scan signal line S2, the third scan signal line S3, the fourth scan signal line S4 and the light emitting signal line EM are high-level signals.

The signal of the fourth scan signal line S4 is a high-level signal, the second transistor T2 is continuously turned on, the signals of the first scan signal line S1, the third scan signal line S3, the second scan signal line S2 and the light emitting signal line EM are high-level signals, and the first transistor T1, the fourth transistor T4, the fifth transistor T5, the sixth transistor T6, the seventh transistor T7 and the eighth transistor T8 are turned off. Although the signal of the data signal line DATA stops being written, signals of the second node N2 is provided to the first node N1 through the turned-on third transistor T3, the third node N3, and the turned-on second transistor T2, to continuously compensate the threshold voltage of the third transistor T3.

A fifth stage is referred to as a reset stage for the second node N2 and the fourth node N4. The signals of the second scan signal line S2 and the fourth scan signal line S4 are low-level signals, and the signals of the first scan signal line S1, the third scan signal line S3 and the light emitting signal line EM are high-level signals.

The signals of the first scan signal line S1, the third scan signal line S3, and the light emitting signal line EM are high-level signals, the signal of the fourth scan signal line S4 is a low-level signal, and the first transistor T1, the second transistor T2, the fourth transistor T4, the fifth transistor T5, and the sixth transistor T6 are all turned off. The signal of the second scan signal line S2 is a low-level signal, the seventh transistor T7 and the eighth transistor T8 are turned on, because the third transistor T3 is continuously turned on in this stage, the signal of the third initial signal line INIT3 is written into the second node N2 and the third node N3, and the signal of the second initial signal line INIT2 is written into the fourth node N3, to reset the second node N2, the third node N3 and the fourth node N4 respectively. The potentials of the second node N2 and the third node N3 are Vinit3, and the potential of the fourth node N4 is Vinit2. The reset of the second node N2 and the third node N3 and the fourth node N4 can eliminate or alleviate a hysteresis deviation caused by the difference in grayscale between adjacent pixels, reduce the hysteresis deviation, and can further periodically reset the anode of the OLED to improve low-frequency flickering.

A sixth stage is referred to as a light emitting stage. The signals of the light emitting signal line EM and the fourth scan signal line S4 are low-level signals, and the signals of the first scan signal line S1, the second scan signal line S2 and the third scan signal line S3 are high-level signals. The signal of the light emitting signal line E is a low-level signal, so that the fifth transistor T5 and the sixth transistor T6 are turned on, and the power supply voltage output from the first power supply line VDD provides a driving voltage to the first electrode of the light emitting device EL through the fifth transistor T5, the third transistor T3 and the sixth transistor T6 which are turned on, to drive the light emitting device EL to emit light.

In a drive process of the pixel drive circuit, a drive current flowing through the third transistor T3 (drive transistor) is determined by a voltage difference between the gate electrode and the first electrode of the third transistor T3. Because the voltage of the first node N1 is Vdata−|Vth|, the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the light emitting device EL, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

It can be seen from the derivation result of the above current formula that in the light emitting stage, the drive current of the third transistor T3 is not affected by the threshold voltage of the third transistor T3. Therefore, the influence of the threshold voltage of the third transistor T3 on the drive current is eliminated, which can ensure uniformity of the display brightness of the display product, and improve the overall display effect of the display product.

An exemplary embodiment of the present disclosure provides a display substrate. In an exemplary embodiment, on a plane perpendicular to the display substrate, the display substrate may include a drive structure layer disposed on the base substrate and a light emitting structure layer disposed on a side of the drive structure layer away from the base substrate. On a plane parallel to the display substrate, the drive structure layer may include a plurality of circuit units forming a plurality of unit rows and a plurality of unit columns, and at least one circuit unit may include a pixel drive circuit configured to output a corresponding current to the connected light emitting device. The light emitting structure layer may include a plurality of light emitting units, at least one light emitting unit may include a light emitting device connected to a pixel drive circuit of the corresponding circuit unit, and the light emitting device is configured to emit light of a corresponding brightness in response to a current output by the connected pixel drive circuit.

In an exemplary embodiment, the circuit units mentioned in the present disclosure refer to regions divided according to pixel drive circuits, and light emitting units mentioned in the present disclosure refer to regions divided according to light emitting devices. In an exemplary implementation, a position and shape of an orthographic projection of a light emitting unit on the base substrate may correspond to a position and shape of an orthographic projection of a circuit unit on the base substrate, or the position and shape of the orthographic projection of the light emitting unit on the base substrate may not correspond to the position and shape of the orthographic projection of the circuit unit on the base substrate.

In an exemplary embodiment, the display substrate of the present disclosure may include a plurality of circuit units, at least one circuit unit includes a pixel drive circuit including at least a compensation transistor of oxide and a drive transistor of polysilicon, a gate electrode of the compensation transistor is connected to a compensation scan signal line configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode.

In an exemplary embodiment, an orthographic projection of the first connection electrode on the plane of the display substrate and an orthographic projection of the compensation scan signal line on the plane of the display substrate do not overlap.

In an exemplary embodiment, the compensation transistor includes at least a compensation active layer, and the first connection electrode and the compensation active layer are both in a shape of a strip extending toward a direction of the drive transistor, and an extension length of the first connection electrode is less than an extension length of the compensation active layer.

In an exemplary embodiment, the second connection electrode comprises at least a first sub-electrode and a second sub-electrode, a first terminal of the first sub-electrode is connected to the second electrode of the drive transistor, a second terminal of the first sub-electrode extends toward a direction away from the drive transistor, a first terminal of the second sub-electrode is connected to the first sub-electrode, a second terminal of the second sub-electrode, after extending toward a direction of the compensation transistor, is connected to a second electrode of the compensation transistor, the first connection electrode is in a shape of a strip extending toward a direction of the drive transistor, and an extension length of the first sub-electrode is less than an extension length of the first sub-electrode.

In an exemplary embodiment, the at least one circuit unit further includes a first power supply line connected to the pixel drive circuit, the first power supply line is configured to provide a first power supply signal to the pixel drive circuit, an orthographic projection of the first power supply line on the plane of the display substrate at least partially overlaps an orthographic projection of the first connection electrode on the plane of the display substrate.

In an exemplary embodiment, the compensation transistor includes at least a compensation active layer, and an orthographic projection of the first power supply line on the plane of the display substrate at least partially overlaps an orthographic projection of the compensation active layer on the plane of the display substrate.

Figure 5:
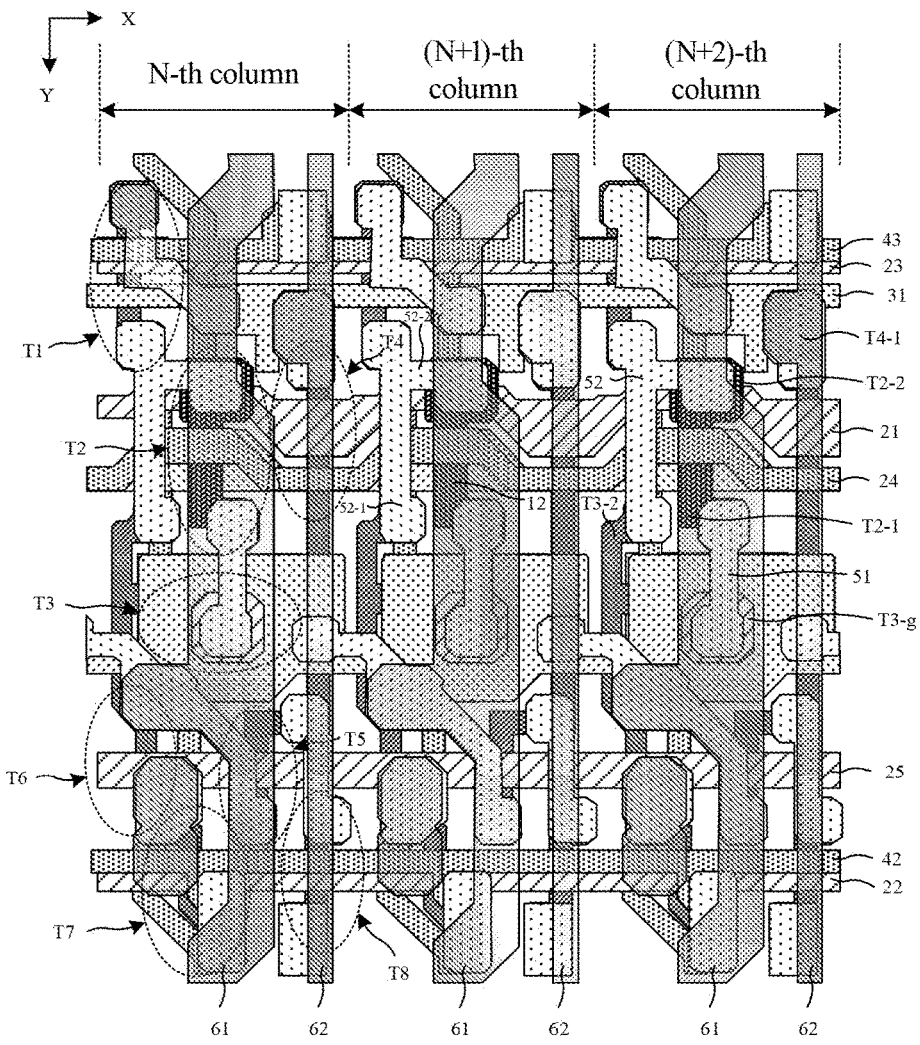
FIG. 5 is a schematic diagram of a planar structure of a display substrate according to an exemplary embodiment of the present disclosure.

FIG. 5 is a schematic diagram of a planar structure of a display substrate according to an exemplary embodiment of the present disclosure. In an exemplary embodiment, the display substrate may include a plurality of circuit units, the plurality of circuit units may form a plurality of unit rows and a plurality of unit columns, the plurality of circuit units in each unit row are arranged sequentially along a first direction X, and the plurality of unit rows are arranged sequentially along a second direction Y, and form a circuit unit array arranged in an array, and the first direction X and the second direction Y intersect.

In an exemplary embodiment, at least one circuit unit may include a pixel drive circuit including at least a storage capacitor and a plurality of transistors, the storage capacitor may include at least a first electrode plate and a second electrode plate, the plurality of transistors may include a first transistor T1, a second transistor T2, a third transistor T3, a fourth transistor T4, a fifth transistor T5, a sixth transistor T6, a seventh transistor T7, and an eighth transistor T8, wherein the second transistor is an oxide transistor and the first, third to eighth transistors are low-temperature polysilicon transistors.

In an exemplary embodiment, the first transistor T1 may serve as the first initialization transistor, a gate electrode of the first transistor T1 is connected to the third scan signal line 23, a first electrode of the first transistor T1 is connected to the first initial signal line 31, and a second electrode of the first transistor T1 is connected to a second electrode of the third transistor T3.

In an exemplary embodiment, the second transistor T2 may serve as the compensation transistor, a gate electrode of the second transistor T2 is connected to the fourth scan signal line 24, the fourth scan signal line 24 may serve as the compensation scan signal line, the first electrode of the second transistor T2 is connected to a gate electrode of the third transistor T3, and the second electrode of the second transistor T2 is connected to the second electrode of the third transistor T3.

In an exemplary embodiment, the third transistor T3 may serve as the drive transistor and the gate electrode of the third transistor T3 and a first electrode plate of the storage capacitor may be of an interconnected integral structure.

In an exemplary embodiment, the fourth transistor T4 may serve as the data writing transistor, a gate electrode of the fourth transistor T4 is connected to the first scan signal line 21, a first electrode of the fourth transistor T4 is connected to the data signal line 62, and a second electrode of the fourth transistor T4 is connected to a first electrode of the third transistor T3.

In an exemplary embodiment, the fifth transistor T5 and the sixth transistor T6 may serve as light emitting control transistors, gate electrodes of the fifth transistor T5 and the sixth transistor T6 are connected to the light emitting signal line 25, a first electrode of the fifth transistor T5 is connected to the first power supply line 61, a second electrode of the fifth transistor T5 is connected to the first electrode of the third transistor T3, a first electrode of the sixth transistor T6 is connected to the second electrode of the third transistor T3, and a second electrode of the sixth transistor T6 is connected to a second electrode of the seventh transistor T7.

In an exemplary embodiment, the seventh transistor T7 may serve as the second initialization transistor, a gate electrode of the seventh transistor T7 is connected to the second scan signal line 22, the first electrode of the seventh transistor T7 is connected to the second initial signal line 42, and the second electrode of the seventh transistor T7 is connected to the second electrode of the sixth transistor T6.

In an exemplary embodiment, the eighth transistor T8 may serve as the third initialization transistor, a gate electrode of the eighth transistor T8 is connected to the second scan signal line 22, a first electrode of the eighth transistor T8 is connected to the third initial signal line 43, and a second electrode of the eighth transistor T8 is connected to the first electrode of the third transistor T3.

In an exemplary embodiment, the first scan signal line 21, the second scan signal line 22, the third scan signal line 23, the fourth scan signal line 24, the light emitting signal line 25, the first initial signal line 31, the second initial signal line 42, and the third initial signal line 43 may be in a shape of a straight line or a bending line in which a main portion extends in the first direction X, and the first power supply line 61 and the data signal line 62 may be in a shape of a straight line or a bending line in which a main portion extends in the second direction Y.

In the present disclosure, "A extends along B direction" means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction. In following description, "A extends in B direction" means "a main body portion of A extends in B direction".

In an exemplary embodiment, the second transistor of oxide T2 may include at least a gate electrode, a first electrode and a second electrode, the fourth scan signal line 24 may serve as the gate electrode of the second transistor T2, the first electrode T2-1 of the second transistor may be located on a side of the fourth scan signal line 24 close to the gate electrode T3-g of the third transistor, and the second electrode T2-2 of the second transistor may be located on a side of the fourth scan signal line 24 away from the gate electrode T3-g of the third transistor.

In an exemplary embodiment, the first electrode T2-1 of the second transistor may be connected to the gate electrode T3-g of the third transistor through the first connection electrode 51, and the second electrode T2-2 of the second transistor may be connected to the second electrode T3-2 of the third transistor through the second connection electrode 52.

In an exemplary embodiment, the first connection electrode 51 may be in a shape of a strip extending along the second direction Y (toward a direction of the third transistor T3), a first terminal of the first connection electrode 51 is connected to the first electrode T2-1 of the second transistor, and a second terminal of the first connection electrode 51, after extending along the second direction Y, is connected to the gate electrode T3-g of the third transistor.

In an exemplary embodiment, the second connection electrode 52 may include at least a first sub-electrode 52-1 and a second sub-electrode 52-2, a first terminal of the first sub-electrode 52-1 is connected to the second electrode T3-2 of the third transistor, a second terminal of the first sub-electrode 52-1 extends in a direction opposite to the second direction Y (toward a direction away from the third transistor T3), a first terminal of the second sub-electrode 52-2 is connected to the first sub-electrode 52-1, a second terminal of the second sub-electrode 52-2, after extending in the first direction X (toward a direction of the second transistor T2), is connected to the second electrode T2-2 of the second transistor.

In an exemplary embodiment, an extension length of the first connection electrode 51 may be less than an extension length of the first sub-electrode 52-1, the extension length being the length in the second direction Y.

In an exemplary embodiment, the second transistor T2 may further include a second active layer 12, which may serve as the compensation active layer, the second active layer 12 may be in a shape of a strip extending along the second direction Y (toward a direction of the third transistor T3), and an extension length of the first connection electrode 51 may be less than an extension length of the second active layer 12.

In an exemplary embodiment, the first connection electrode 51 may be located at a side of the fourth scan signal line 24 close to the gate electrode T3-g of the third transistor, and an orthographic projection of the first connection electrode 51 on the plane of the display substrate and an orthographic projection of the fourth scan signal line 24 on the plane of the display substrate do not overlap.

In an exemplary embodiment, an orthographic projection of the first power supply line 61 on the plane of the display substrate at least partially overlaps an orthographic projection of the first connection electrode 51 on the plane of the display substrate.

In an exemplary embodiment, an orthographic projection of the first power supply line 61 on the plane of the display substrate overlaps at least partially an orthographic projection of the second active layer 12 on the plane of the display substrate.

In an exemplary embodiment, the first scan signal line 21 may be disposed at a side of the fourth scan signal line 24 away from the gate electrode T3-g of the third transistor, and the first electrode T4-1 of the fourth transistor may be disposed at a side of the fourth scan signal line 24 away from the gate electrode T3-g of the third transistor, and an orthographic projection of the first connection electrode 51 on the plane of the display substrate does not overlap an orthographic projection of the first scan signal line 21 on the plane of the display substrate.

In an exemplary embodiment, an orthographic projection of the second initial signal line 42 on the plane of the display substrate overlaps at least partially an orthographic projection of the second scan signal line 22 on the plane of the display substrate.

In an exemplary embodiment, an orthographic projection of the third initial signal line 43 on the plane of the display substrate overlaps at least partially an orthographic projection of the third scan signal line 23 on the plane of the display substrate.

In an exemplary embodiment, on a plane perpendicular to the display substrate, the display substrate may include a plurality of conductive layers sequentially disposed on the base substrate, the first initial signal line 31 and the second initial signal line 42 may be disposed in different conductive layers, and the second initial signal line 42 and the third initial signal line 43 may be disposed in the same conductive layer.

Exemplary description is made below through a manufacturing process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation, and chemical vapor deposition, coating may be any one or more of spray coating, spin coating, and inkjet printing, and etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are disposed in a same layer" in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A contains an orthographic projection of B" refers to that a boundary of the orthographic projection of B falls within a range of a boundary of the orthographic projection of A, or the boundary of the orthographic projection of A coincides with the boundary of the orthographic projection of B.

In an exemplary embodiment, taking three circuit units (1 unit rows and 3 unit columns) as an example, the preparation process for the display substrate in this embodiment may include the following operations.

Figure 6:
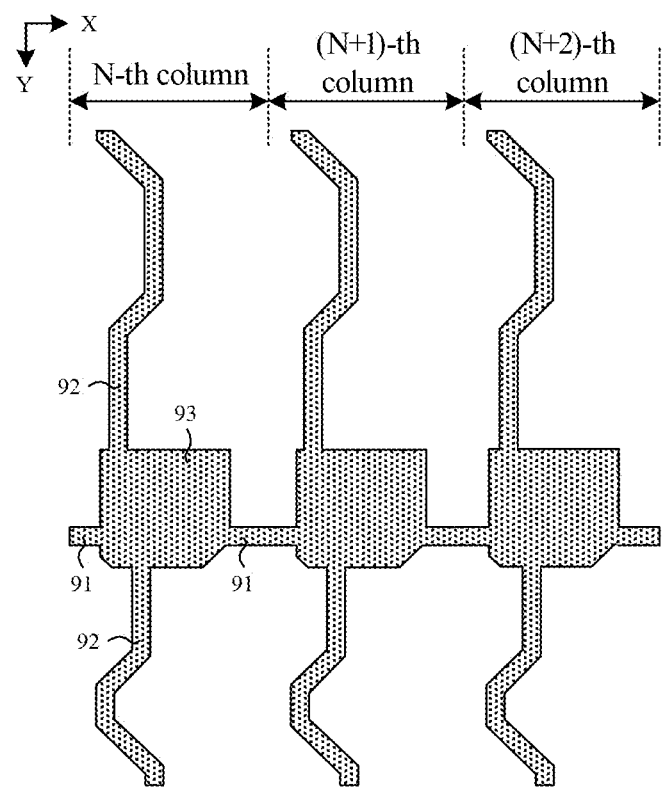
FIG. 6 is a schematic diagram of a display substrate after a pattern of a shielding layer is formed according to the present disclosure.

(11) A pattern of a shielding layer is formed. In an exemplary embodiment, forming the pattern of the shielding layer may include: depositing a shielding thin film on a base substrate, patterning the shielding thin film through a patterning process to form a pattern of a shielding layer on the base substrate, as shown in FIG. 6.

In an exemplary embodiment, the pattern of the shielding layer of each circuit unit may include at least a first shielding electrode line 91, a second shielding electrode line 92 and a shielding electrode 93.

In an exemplary embodiment, the shielding electrode 93 may be in a shape of a rectangle, corners of the rectangle may be provided with chamfers. The first shielding electrode line 91 may be in a shape of a straight line extending along the first direction X, and the first shielding electrode line 91 may be provided at two sides of the shielding electrode 93 in the first direction X and connected to the shielding electrode 93. The second shielding electrode line 92 may be in a shape of bending line extending along the second direction Y, and the second shielding electrode line 92 may be provided at two sides of the shielding electrode 93 in the second direction Y and connected to the shielding electrode 93.

In an exemplary embodiment, the first shielding electrode line 91 of each circuit unit is connected with the first shielding electrode lines 91 of circuit units adjacent in the first direction X, so that a plurality of shielding electrodes 93 and the first shielding electrode lines 91 in one unit row are connected into a whole to form an interconnected integral structure.

In an exemplary embodiment, the second shielding electrode lines 92 of each circuit unit are connected to the second shielding electrode lines 92 of circuit units adjacent in the second direction Y, so that the shielding electrodes 93 and the second shielding electrode lines 92 in one unit column are connected into a whole to form an interconnected integral structure.

In an exemplary embodiment, shielding layers in a unit row and a unit column are connected into a whole, which may ensure that the shielding layers in the display substrate have a same potential, which is beneficial to improving uniformity of a panel, avoiding poor display of the display substrate, and ensuring a display effect of the display substrate.

In an exemplary embodiment, the positions and shapes of the shielding layers of adjacent unit columns may be substantially the same.

Figure 7A:
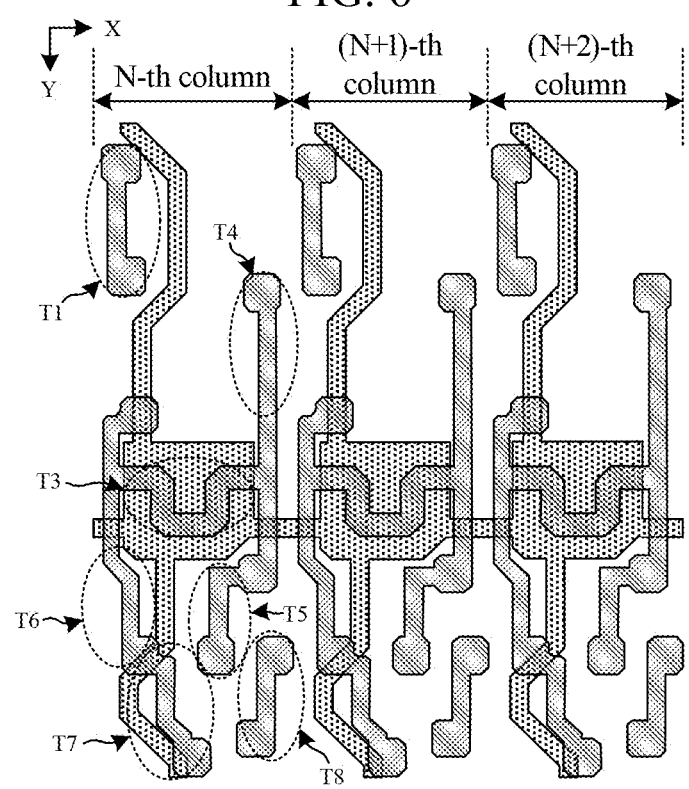
FIG. 7A and FIG. 7B are schematic diagrams of a display substrate after a pattern of a first semiconductor layer is formed according to the present disclosure.
Figure 7B:
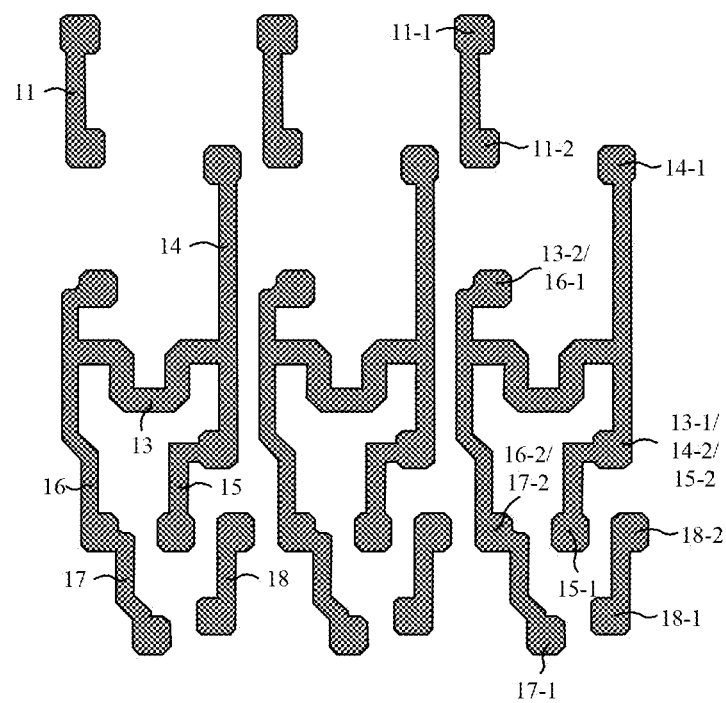

(12) Forming a pattern of a first semiconductor layer. In an exemplary embodiment, forming a pattern of a first semiconductor may include: sequentially depositing a first insulation thin film and a first semiconductor thin film on the base substrate, patterning the first semiconductor thin film through a patterning process to form a first insulation layer covering the shielding layer, and a pattern of a first semiconductor disposed on the first insulation layer, as shown in FIG. 7A and FIG. 7B, and FIG. 7B is a schematic plan view of the first semiconductor layer in FIG. 7A.

In an exemplary embodiment, the pattern of the first semiconductor layer of each circuit unit may include at least a first active layer 11 of the first transistor T1, a third active layer 13 of the third transistor T3 to an eighth active layer 18 of the eighth transistor T8, and the third active layer 13 to the seventh active layer 17 are of an interconnected integral structure, and the first active layer 11 and the eighth active layer 18 are separately disposed.

In an exemplary embodiment, an orthographic projection of the third active layer 13 on the base substrate at least partially overlaps an orthographic projection of the shielding electrode 93 on the base substrate.

In an exemplary embodiment, in the first direction X, the first active layer 11 and the sixth active layer 16 may be located at a side of the third active layer 13 in the present circuit unit in an opposite direction of the first direction X, and the fourth active layer 14 and the eighth active layer 18 may be located at a side of the third active layer 13 in the present circuit unit in the first direction X. In the second direction Y, the first active layer 11 and the fourth active layer 14 may be located at a side of the third active layer 13 in the present circuit unit in an opposite direction of the second direction Y, and the fifth active layer 15, the sixth active layer 16, the seventh active layer 17 and the eighth active layer 18 may be located at a side of the third active layer 13 in the present circuit unit in the second direction Y.

In an exemplary embodiment, the third active layer 13 may be in a shape of an inverted "Ω", and the first active layer 11, the fourth active layer 14 to the eighth active layer 18 may be in a shape of an "I".

In an exemplary embodiment, the first active layer 11, the third active layer 13 to the eighth active layer 18 may each include a first region, a second region, and a channel region located between the first region and the second region. In an exemplary embodiment, the first region 13-1 of the third active layer may simultaneously serve as the second region 14-2 of the fourth active layer and the second region 15-2 of the fifth active layer, the second region 13-2 of the third active layer may serve as the first region 16-1 of the sixth active layer, the second region 16-2 of the sixth active layer may serve as the second region 17-2 of the seventh active layer, the first region 11-1 of the first active layer, the second region 11-2 of the first active layer, the first region 14-1 of the fourth active layer, the first region 15-1 of the fifth active layer, the first region 17-1 of the seventh active layer, the first region 18-1 of the eighth active layer and the second region 18-2 of the eighth active layer may be separately disposed.

In an exemplary embodiment, the positions and shapes of the first semiconductor layers of adjacent unit columns may be substantially the same.

In an exemplary embodiment, the first semiconductor layer may be made of polysilicon (p-Si), i.e., the first transistor and the third to eighth transistors are LTPS transistors. In an exemplary embodiment, the patterning the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a poly silicon thin film. Subsequently, the poly silicon thin film is patterned to form the pattern of the first semiconductor layer.

Figure 8A:
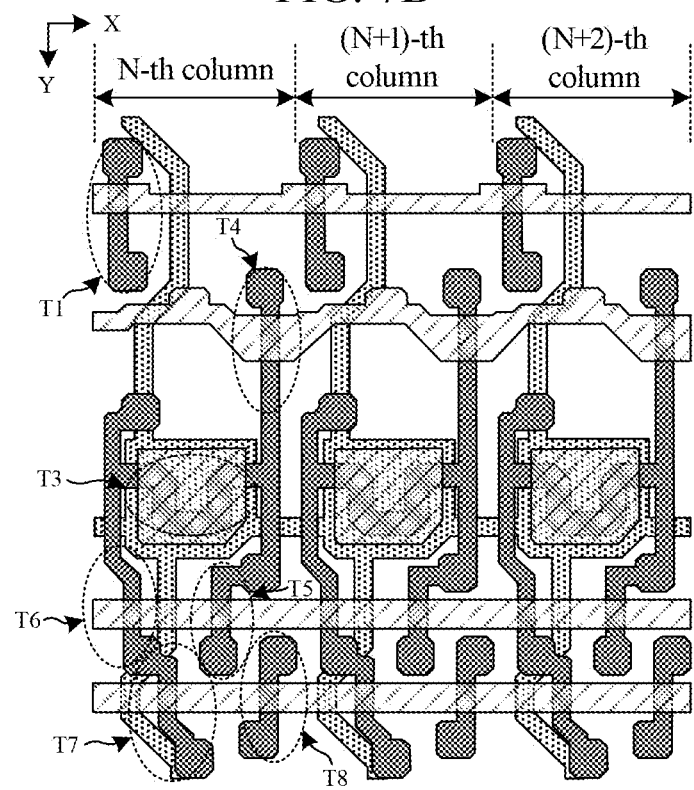
FIG. 8A and FIG. 8B are schematic diagrams of a display substrate after a pattern of a first conductive layer is formed according to the present disclosure.
Figure 8B:
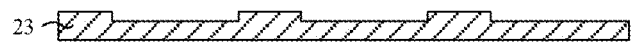
Figure 8B:
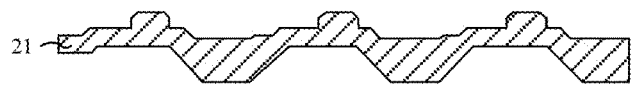
Figure 8B:
Figure 8B:
Figure 8B:
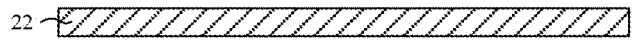

(13) A pattern of a first conductive layer is formed. In an exemplary implementation, forming the pattern of the first conductive layer may include: depositing sequentially a second insulation thin film and a first conductive thin film on the base substrate on which the aforementioned patterns are formed, and patterning the first conductive thin film through a patterning process to form a second insulation layer that covers a pattern of the first semiconductor layer and form the pattern of the first conductive layer arranged on the second insulation layer, as shown in FIG. 8A and FIG. 8B, and FIG. 8B is a planar schematic diagram of the first conductive layer in FIG. 8A. In an exemplary embodiment, the first conductive layer may be referred to as a first gate metal (GATE1) layer.

In an exemplary embodiment, the pattern of the first conductive layer of each circuit unit at least includes: a first scan signal line 21, a second scan signal line 22, a third scan signal line 23, a light emitting signal line 25, and a first electrode plate 26 of a storage capacitor.

In an exemplary embodiment, the first electrode plate 26 may be in a shape of a rectangle, and a chamfer may be provided at a corner of the rectangle. An orthographic projection of the first electrode plate 26 on the base substrate is at least partially overlapped with an orthographic projection of the third active layer of the third transistor T3 on the base substrate. In an exemplary implementation, the first electrode plate 26 may serve as an electrode plate of the storage capacitor and a gate electrode of the third transistor T3 simultaneously.

In an exemplary embodiment, the first scan signal line 21 may be in a shape of a bending line in which a main portion extends along the first direction X, the first scan signal line 21 may be located on a side of the first electrode plate 26 in an opposite direction of the second direction Y, and a region where the first scan signal line 21 overlaps the fourth active layer may serve as the gate electrode of the fourth transistor T4.

In an exemplary embodiment, the second scan signal line 22 may be in a shape of a straight line or a bending line in which a main portion extends along the first direction X, the second scan signal line 22 may be located on a side of the first electrode plate 26 in the second direction Y, a region where the second scan signal line 22 overlaps the seventh active layer may serve as the gate electrode of the seventh transistor T7, and a region where the second scan signal line 22 overlaps the eighth active layer may serve as the gate electrode of the eighth transistor T8.

In an exemplary embodiment, the third scan signal line 23 may be in a shape of a straight line or a bending line in which a main portion extends along the first direction X, the third scan signal line 23 may be located at a side of the first scan signal line 21 away from the first electrode plate 26, and a region where the third scan signal line 23 overlaps the first active layer may serve as the gate electrode of the first transistor T1.

In an exemplary embodiment, the light emitting signal line 25 may be in a shape of a straight line or a bending line in which a main portion extends along the first direction X, the light emitting signal line 25 may be located between the second scan signal line 22 and the first electrode plate 26, a region where the light emitting signal line 25 overlaps the fifth active layer may serve as the gate electrode of the fifth transistor T5, and a region where the light emitting signal line 25 overlaps the sixth active layer may serve as the gate electrode of the sixth transistor T6.

In an exemplary embodiment, the first scan signal line 21, the second scan signal line 22, the third scan signal line 23, and the light emitting signal line 25 may be designed with an equal width or a non-equal width, and the width is the size in the second direction Y, which may not only facilitate a layout of a pixel structure, but also reduce a parasitic capacitance between signal lines, which is not limited here in the present disclosure.

In an exemplary embodiment, the first scan signal line 21 and the third scan signal line 23 may include a region overlapping with the first semiconductor layer and a region not overlapping with the first semiconductor layer, and the width of the signal line in the region overlapping with the first semiconductor layer may be greater than the width of the signal line in the region not overlapping with the first semiconductor layer.

In an exemplary embodiment, the positions and shapes of the first conductive layers of adjacent unit columns may be substantially the same.

In an exemplary embodiment, after the pattern of the first conductive layer is formed, the first semiconductor layer may be subjected to a conductive treatment by using the first conductive layer as a shield, a region of the first semiconductor layer, which is shielded by the first conductive layer, forms channel regions of the first transistor T1, the third transistor T3 to the eighth transistor T8, and a region of the first semiconductor layer, which is not shielded by the first conductive layer, is made be conductive, that is, the first regions and second regions of the first transistor T1, the third transistor T3 to the eighth transistor T8 are all made be conductive.

Figure 9A:
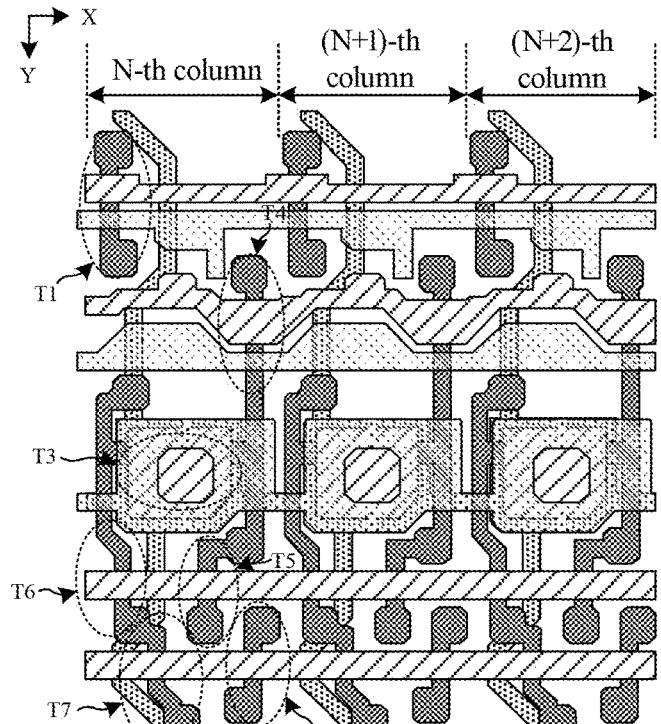
FIG. 9A and FIG. 9B are schematic diagrams of a display substrate after a pattern of a second conductive layer is formed according to the present disclosure.
Figure 9B:
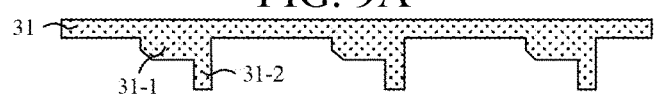
Figure 9B:
Figure 9B:
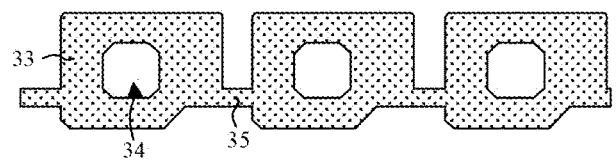

(14) A pattern of a second conductive layer is formed. In an exemplary implementation, forming a pattern of a second conductive layer may include: a third insulation thin film and a second conductive thin film are sequentially deposited on the base substrate on which the aforementioned patterns are formed, and the second conductive thin film is patterned through a patterning process to form a third insulation layer that covers the first conductive layer and the pattern of the second conductive layer arranged on the third insulation layer, as shown in FIG. 9A and FIG. 9B. FIG. 9B is a schematic plan view of the second conductive layer in FIG. 9A. In an exemplary embodiment, the second conductive layer may be referred to as a second gate metal (GATE2) layer.

In an exemplary embodiment, the pattern of the second conductive layer of each circuit unit includes at least a first initial signal line 31, a shielding line 32 and a second electrode plate 33 of the storage capacitor.

In an exemplary embodiment, the first initial signal line 31 may be in a shape of a straight line or a bending line in which a main portion extends along the first direction X, and the first initial signal line 31 may be located between the first scan signal line 21 and the third scan signal line 23.

In an exemplary embodiment, a first initial connection block 31-1 is provided on a side of the first initial signal line 31 of each circuit unit close to the first scan signal line 21. The first initial connection block 31-1 may be in a shape of a block (e.g., a rectangle), a first terminal of the first initial connection block 31-1 is connected to the first initial signal line 31, a second terminal of the first initial connection block 31-1 extends towards the direction of the first scan signal line 21, and the first initial connection block 31-1 is configured to be connected to the first region of the first active layer through a seventh connection electrode formed subsequently.

In an exemplary embodiment, a side of the first initial signal line 31 of each circuit unit close to the first scan signal line 21 may be provided with a shield strip 31-2. The shield strip 31-2 may be in a shape of a strip extending along the second direction Y, a first terminal of the shield strip 31-2 is connected to the first initial signal line 31, a second terminal of the shield strip 31-2 extends in the direction of the first scan signal line 21, the shield strip 31-2 is configured to be disposed between the first region of the fourth active layer and the second region of the second active layer, to provide shielding between the first electrode of the fourth transistor T4 and the second electrode of the second transistor T2 to avoid an influence of the data voltage jump on the performance of the second transistor T2.

In an exemplary embodiment, the first initial signal line 31, the first initial connection block 31-1 and the shield strip 31-2 may be of an interconnected integral structure.

In an exemplary embodiment, the shielding line 32 may be in a shape of a straight line or a bending line in which a main portion extends along the first direction X, the shielding line 32 may be located between the first scan signal line 21 and the first electrode plate 26, and the shielding line 32 is configured as a shielding layer of the second transistor T2, shielding the channel region of the second transistor T2, ensuring the electrical performance of the oxide second transistor T2, and is also configured to serve as a bottom gate electrode of the second transistor T2.

In an exemplary embodiment, the shielding line 32 may be designed with a non-equal width which not only may improve the shielding effect but also may facilitate the layout of the pixel structure and reduce the parasitic capacitance between the signal lines.

In an exemplary embodiment, a profile of second electrode plate 33 may be in a shape of a rectangle, a chamfer may be provided at a corner of the rectangle, an orthographic projection of the second electrode plate 33 on the base substrate is at least overlapped with an orthographic projection of the first electrode plate 26 on the base substrate, the second electrode plate 33 may serve as anther plate of the storage capacitor, and the first electrode plate 26 and the second electrode plate 33 form the storage capacitor of the pixel drive circuit.

In an exemplary embodiment, the second electrode plate 33 is provided with an opening 34 which may have a rectangular shape and may be located in the middle region of the second electrode plate 33, so that the second electrode plate 33 forms an annular structure. The opening 34 exposes the third insulation layer covering the first electrode plate 26, and an orthographic projection of the first electrode plate 26 on the base substrate contains an orthographic projection of the opening 34 on the base substrate. In an exemplary implementation, the opening 34 is configured to accommodate a thirteenth via formed subsequently, and the thirteenth via is located within the opening 34 and exposes the first electrode plate 26, so that a first connection electrode formed subsequently is connected with the first electrode plate 26.

In an exemplary embodiment, an electrode plate connection strip 35 is provided on a side of the second electrode plate 33 in the first direction X or in an opposite direction of the first direction X. The electrode plate connection strip 35 may be in a shape of a strip extending along the first direction X, a first terminal of the electrode plate connection strip 35 is connected to the second electrode plate 33 in the present circuit unit, and a second terminal of the electrode plate connection strip 35 is connected to the second electrode plate 33 in the circuit unit adjacent in the first direction X, so that the second electrode plates 33 in adjacent circuit units in one unit row form an integral structure connected to each other. Because the second electrode plate 33 in each circuit unit is connected with a first power supply line formed subsequently, by forming the integral structure in which the second electrode plates 33 of adjacent circuit units are connected with each other, the second electrode plate of the integral structure can be multiplexed as a power supply signal line, so that a plurality of second electrode plates in a unit row can be guaranteed to have a same potential, which is beneficial for improving the uniformity of the panel, avoiding poor display of the display substrate and ensuring the display effect of the display substrate.

In an exemplary embodiment, the positions and shapes of the second conductive layers of adjacent unit columns may be substantially the same.

Figure 10A:
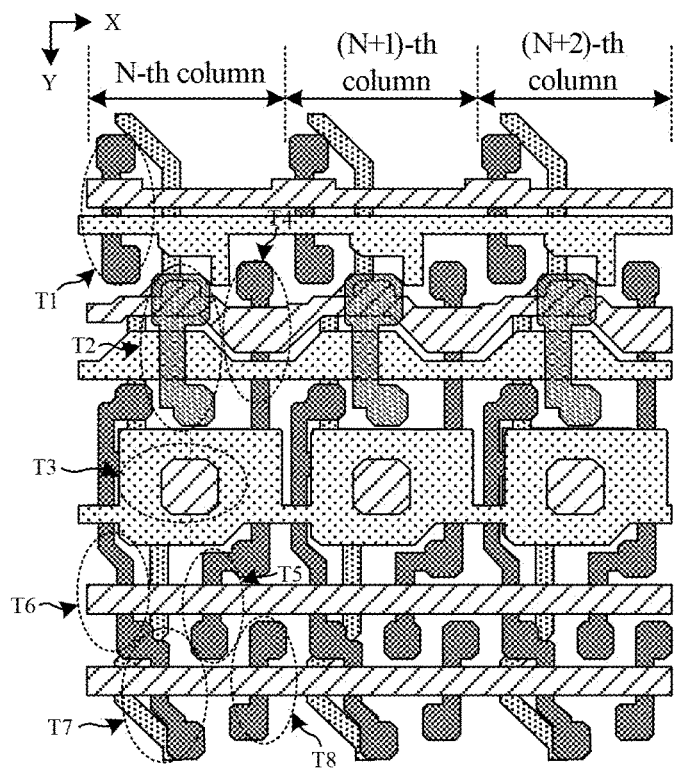
FIG. 10A and FIG. 10B are schematic diagrams of a display substrate after a pattern of a second semiconductor layer is formed according to the present disclosure.
Figure 10B:
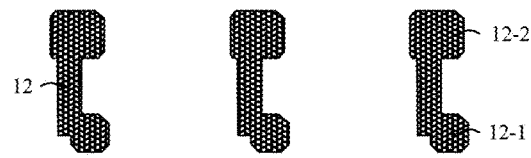

(15) Forming a pattern of a second semiconductor layer. In an exemplary embodiment, forming a pattern of a second semiconductor layer may include: depositing a fourth insulation thin film and a second semiconductor thin film sequentially on the base substrate on which the above-mentioned patterns are formed, patterning the second semiconductor thin film through a patterning process to form a fourth insulation layer that covers the base substrate and the pattern of the second semiconductor layer arranged on the fourth insulation layer, as shown in FIG. 10A and FIG. 10B, and FIG. 10B is a planar schematic diagram of the second conductive layer in FIG. 10A.

In an exemplary embodiment, the pattern of the second semiconductor layer of each circuit unit at least includes a second active layer 12 of the second transistor T2.

In an exemplary embodiment, the second active layer 12 may be in a shape of a strip extending along the second direction Y, may be located between the first initial signal line 31 and the second electrode plate 33, and an orthographic projection of the second active layer 12 on the base substrate at least partially overlaps an orthographic projection of the shielding line 32 on the base substrate.

In an exemplary embodiment, the first region 12-1 of the second active layer may be located at a side of the shielding line 32 close to the first and second electrode plates 26 and 33, and the second region 12-2 of the second active layer may be located at a side of the shielding line 32 away from the first and second electrode plates 26 and 33.

In an exemplary embodiment, the positions and shapes of the second semiconductor layers of adjacent unit columns may be substantially the same.

In an exemplary embodiment, the second semiconductor layer may be made of an oxide, i.e., the eighth transistor T8 is an oxide transistor. In an exemplary embodiment, the second semiconductor thin film may be made of Indium Gallium Zinc Oxide (IGZO), wherein electron mobility of the Indium Gallium Zinc Oxide (IGZO) is higher than that of amorphous silicon.

Figure 11A:
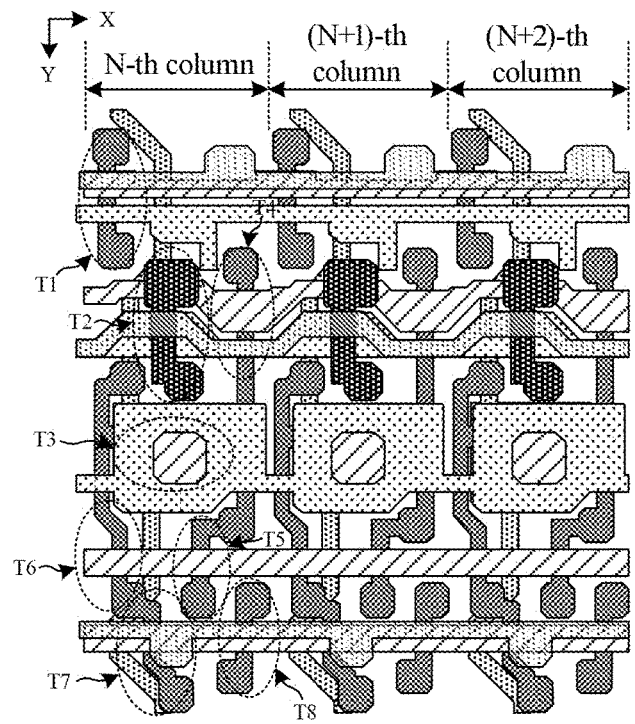
FIG. 11A and FIG. 11B are schematic diagrams of a display substrate after a pattern of a third conductive layer is formed according to the present disclosure.
Figure 11B:
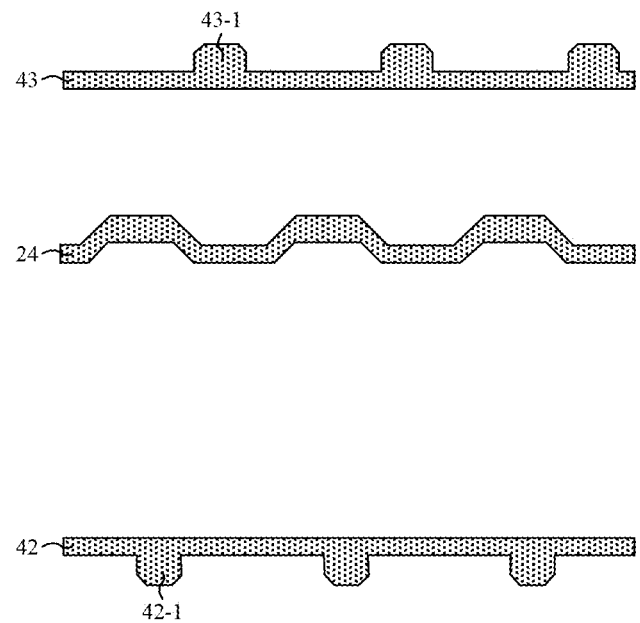

(16) Forming a pattern of a third conductive layer. In an exemplary embodiment, forming the pattern of the third conductive layer may include: on the base substrate on which the aforementioned patterns are formed, depositing a fifth insulating thin film and a third conductive thin film sequentially, and patterning the third conductive thin film by a patterning process to form a fifth insulating layer covering the second semiconductor layer and the pattern of the third conductive layer disposed on the fifth insulating layer, as shown in FIGS. 11A and 11B, FIG. 11B is a schematic plan view of the third conductive layer in FIG. 11A. In an exemplary embodiment, the second conductive layer may be referred to as a third gate metal (GATE3) layer.

In an exemplary embodiment, the pattern of the third conductive layer of each circuit unit includes at least a fourth scan signal line 24, a second initial signal line 42 and a third initial signal line 43.

In an exemplary embodiment, the fourth scan signal line 24 may be in a shape of a straight line or a bending line in which a main portion extends along the first direction X, the fourth scan signal line 24 may be located between the first scan signal line 21 and the first electrode plate 26, an orthographic projection of the fourth scan signal line 24 on the base substrate at least partially overlaps an orthographic projection of the shielding line 32 on the base substrate, and a region where the fourth scan signal line 24 overlaps the second active layer may serve as a gate electrode of the second transistor T2.

In an exemplary embodiment, the fourth scan signal line 24 may serve as a compensation scan signal line, the first region 12-1 of the second active layer may be located at a side of the fourth scan signal line 24 close to the first and second electrode plates 26 and 33, and the second region 12-2 of the second active layer may be located at a side of the fourth scan signal line 24 away from the first and second electrode plates 26 and 33.

In an exemplary embodiment, the fourth scan signal line 24 and the shielding line 32 may be connected to the same signal source so that the shielding line 32 may serve as a bottom gate electrode of the second transistor T2, and the fourth scan signal line 24 may serve as a top gate electrode of the second transistor T2 to form the second transistor T2 with a top gate and bottom gate structure.

In an exemplary embodiment, the first region of the fourth active layer (the first electrode of the fourth transistor T4) may be located at a side of the fourth scan signal line 24 away from the storage capacitor.

In an exemplary embodiment, the second initial signal line 42 may be in a shape of a straight line or a bending line in which a main portion extends along the first direction X, and may be located on a side of the light emitting signal line 25 away from the second electrode plate 33. The second initial signal line 42 of each circuit unit is provided with a second initial connection block 42-1, a first terminal of which is connected to the second initial signal line 42, a second terminal of which extends in a direction away from the second electrode plate 33, and the second initial connection block 42-1 is configured to be connected to a first region of the seventh active layer through an eighth connection electrode formed subsequently.

In an exemplary embodiment, an orthographic projection of the second initial signal line 42 on the base substrate at least partially overlaps an orthographic projection of the second scan signal line 22 on the base substrate, and the second initial signal line 42 with a constant voltage may play a shielding role to reduce the influence of the second scan signal line 22 on the pixel drive circuit.

In an exemplary embodiment, the third initial signal line 43 may be in a shape of a straight line or a bending line in which a main portion extends along the first direction X, and may be located on a side of the first initial signal line 31 away from the second electrode plate 33. The third initial signal line 43 of each circuit unit is provided with a third initial connection block 43-1, a first terminal of which is connected to the third initial signal line 43, a second terminal of which extends in a direction away from the second electrode plate 33, and the third initial connection block 43-1 is configured to be connected to the first region of the eighth active layer through a ninth connection electrode formed subsequently.

In an exemplary embodiment, an orthographic projection of the third initial signal line 43 on the base substrate at least partially overlaps an orthographic projection of the third scan signal line 23 on the base substrate, and the third initial signal line 43 with a constant voltage may play a shielding role to reduce the influence of the third scan signal line 23 on the pixel drive circuit.

In an exemplary embodiment, the position and shape of the third conductive layers of adjacent unit columns may be substantially the same.

Figure 12:
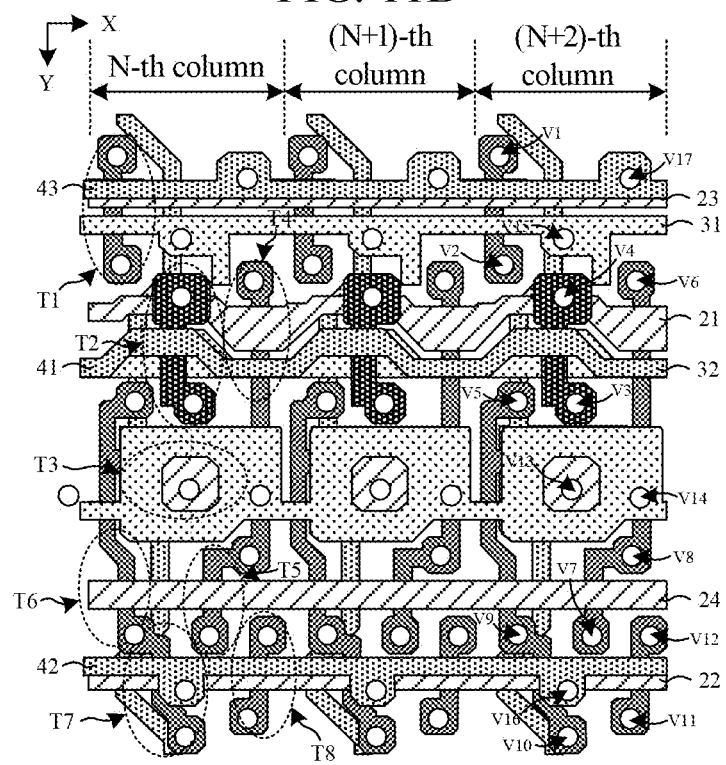
FIG. 12 is a schematic diagram of a display substrate after a pattern of a sixth insulating layer is formed according to the present disclosure.

(17) Forming a pattern of a sixth insulation layer. In an exemplary embodiment, forming a pattern of a sixth insulation layer may include: depositing a sixth insulation thin film on the base substrate on which the aforementioned patterns are formed, patterning the fifth insulation thin film using a patterning process to form a sixth insulation layer covering the third conductive layer, and a plurality of vias are provided on the sixth insulation layer, as shown in FIG. 12.

In an exemplary embodiment, the plurality of vias of each circuit unit includes at least a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, a thirteenth via V13, a fourteenth via V14, a fifteenth via V15, a sixteenth via V16, and a seventeenth via V17.

In an exemplary embodiment, an orthographic projection of the first via V1 on the base substrate is within a range of an orthographic projection of the first region of the first active layer on the base substrate, the sixth insulating layer, the fifth insulating layer, the fourth insulating layer, the third insulating layer and the second insulating layer within the first via V1 are etched away to expose the surface of the first region of the first active layer, and the first via V1 is configured such that a subsequently formed seventh connection electrode is connected to the first region of the first active layer through the via.

In an exemplary embodiment, an orthographic projection of the second via V2 on the base substrate is within a range of an orthographic projection of the second region of the first active layer on the base substrate, the sixth insulating layer, the fifth insulating layer, the fourth insulating layer, the third insulating layer and the second insulating layer within the second via V2 are etched away to expose the surface of the second region of the first active layer, and the second via V2 is configured such that a subsequently formed second connection electrode is connected to the second region of the first active layer through the via.

In an exemplary embodiment, an orthographic projection of the third via V3 on the base substrate is within a range of an orthographic projection of the first region of the second active layer on the base substrate, the sixth insulating layer and the fifth insulating layer within the third via V3 are etched away to expose the surface of the first region of the second active layer, and the third via V3 is configured such that a subsequently formed first connection electrode is connected to the first region of the second active layer through the via.

In an exemplary embodiment, an orthographic projection of the fourth via V4 on the base substrate is within a range of an orthographic projection of the second region of the second active layer on the base substrate, the sixth insulating layer and the fifth insulating layer within the fourth via V4 are etched away to expose the surface of the second region of the second active layer, and the fourth via V4 is configured such that a subsequently formed second connection electrode is connected to the second region of the second active layer through the via.

In an exemplary embodiment, an orthographic projection of the fifth via V5 on the base substrate is within an orthographic projection of the second region of the third active layer (also the first region of the sixth active layer) on the base substrate, the sixth insulating layer, the fifth insulating layer, the fourth insulating layer, the third insulating layer and the second insulating layer within the fifth via V5 are etched away to expose the surface of the second region of the third active layer (also the first region of the sixth active layer), and the fifth via V5 is configured such that a subsequently formed second connection electrode is connected to the second region of the third active layer (also the first region of the sixth active layer) through the via.

In an exemplary embodiment, an orthographic projection of the sixth via V6 on the base substrate is within a range of an orthographic projection of the first region of the fourth active layer on the base substrate, the sixth insulating layer, the fifth insulating layer, the fourth insulating layer, the third insulating layer and the second insulating layer within the sixth via V6 are etched away to expose the surface of the first region of the fourth active layer, and the sixth via V6 is configured such that a subsequently formed third connection electrode is connected to the first region of the fourth active layer through the via.

In an exemplary embodiment, an orthographic projection of the seventh via V7 on the base substrate is within a range of an orthographic projection of the first region of the fifth active layer on the base substrate, the sixth insulating layer, the fifth insulating layer, the fourth insulating layer, the third insulating layer and the second insulating layer within the seventh via V7 are etched away to expose the surface of the first region of the fifth active layer, and the seventh via V7 is configured such that a subsequently formed fourth connection electrode is connected to the first region of the fifth active layer through the via.

In an exemplary embodiment, an orthographic projection of the eighth via V8 on the base substrate is within an orthographic projection of the second region of the fifth active layer (also the first region of the third active layer and the second region of the fourth active layer) on the base substrate, the sixth insulating layer, the fifth insulating layer, the fourth insulating layer, the third insulating layer and the second insulating layer within the eighth via V8 are etched away to expose the surface of the second region of the fifth active layer, and the eighth via V8 is configured such that a subsequently formed fifth connection electrode is connected to the second region of the fifth active layer (also the first region of the third active layer and the second region of the fourth active layer) through the via.

In an exemplary embodiment, an orthographic projection of the ninth via V9 on the base substrate is within an orthographic projection of the second region of the sixth active layer (also the second region of the seventh active layer) on the base substrate, the sixth insulating layer, the fifth insulating layer, the fourth insulating layer, the third insulating layer and the second insulating layer within the ninth via V9 are etched away to expose the surface of the second region of the sixth active layer (also the second region of the seventh active layer), and the ninth via V9 is configured such that a subsequently formed sixth connection electrode is connected to the second region of the sixth active layer (also the second region of the seventh active layer) through the via.

In an exemplary embodiment, an orthographic projection of the tenth via V10 on the base substrate is within an orthographic projection of the first region of the seventh active layer on the base substrate, the sixth insulating layer, the fifth insulating layer, the fourth insulating layer, the third insulating layer and the second insulating layer within the tenth via V10 are etched away to expose the surface of the first region of the seventh active layer, and the tenth via V10 is configured such that a subsequently formed eighth connection electrode is connected to the first region of the seventh active layer through the via.

In an exemplary embodiment, an orthographic projection of an eleventh via V11 on the base substrate is within an orthographic projection of the first region of the eighth active layer on the base substrate, the sixth insulating layer, the fifth insulating layer, the fourth insulating layer, the third insulating layer and the second insulating layer within the eleventh via V11 are etched away to expose the surface of the first region of the eighth active layer, and the eleventh via V11 is configured such that a subsequently formed ninth connection electrode is connected to the first region of the eighth active layer through the via.

In an exemplary embodiment, an orthographic projection of the twelfth via V12 on the base substrate is within an orthographic projection of the second region of the eighth active layer on the base substrate, the sixth insulating layer, the fifth insulating layer, the fourth insulating layer, the third insulating layer and the second insulating layer within the twelfth via V12 are etched away to expose the surface of the second region of the eighth active layer, and the twelfth via V12 is configured such that a subsequently formed fifth connection electrode is connected to the second region of the eighth active layer through the via.

In an exemplary embodiment, an orthographic projection of the thirteenth via V13 on the base substrate is within a range of an orthographic projection of the opening 34 on the base substrate, the sixth insulating layer, the fifth insulating layer, the fourth insulating layer and the third insulating layer in the thirteenth via V13 are etched away to expose the surface of the first electrode plate 26, and the thirteenth via V13 is configured such that a first connection electrode formed subsequently is connected to the first electrode plate 26 through the via.

In an exemplary embodiment, an orthographic projection of the fourteenth via V14 on the base substrate is within a range of an orthographic projection of the second electrode plate 33 on the base substrate, the sixth insulating layer, the fifth insulating layer and the fourth insulating layer in the fourteenth via V14 are etched away to expose the surface of the second electrode plate 33, and the fourteenth via V14 is configured such that a subsequently formed fourth connection electrode is connected to the second electrode plate 33 through the via.

In an exemplary embodiment, an orthographic projection of the fifteenth via V15 on the base substrate is within a range of an orthographic projection of the first initial connection block 31-1 of the first initial signal line 31 on the base substrate, the sixth insulating layer, the fifth insulating layer and the fourth insulating layer in the fifteenth via V15 are etched away to expose the surface of the first initial connection block 31-1, and the fifteenth via V15 is configured such that a subsequently formed seventh connection electrode is connected to the first initial connection block 31-1 through the via.

In an exemplary embodiment, an orthographic projection of the sixteenth via V16 on the base substrate is within a range of an orthographic projection of the second initial connection block 42-1 of the second initial signal line 42 on the base substrate, the sixth insulating layer in the sixteenth via V16 is etched away to expose the surface of the second initial connection block 42-1, and the sixteenth via V16 is configured such that a subsequently formed eighth connection electrode is connected to the second initial connection block 42-1 through the via.

In an exemplary embodiment, an orthographic projection of the seventeenth via V17 on the base substrate is within a range of an orthographic projection of the third initial connection block 43-1 of the third initial signal line 43 on the base substrate, the sixth insulating layer in the seventeenth via V17 is etched away to expose the surface of the third initial connection block 43-1, and the seventeenth via V17 is configured such that a ninth connection electrode formed subsequently is connected to the third initial connection block 43-1 through the via.

In an exemplary embodiment, the positions and shapes of a plurality of vias of adjacent unit columns may be substantially the same.

Figure 13A:
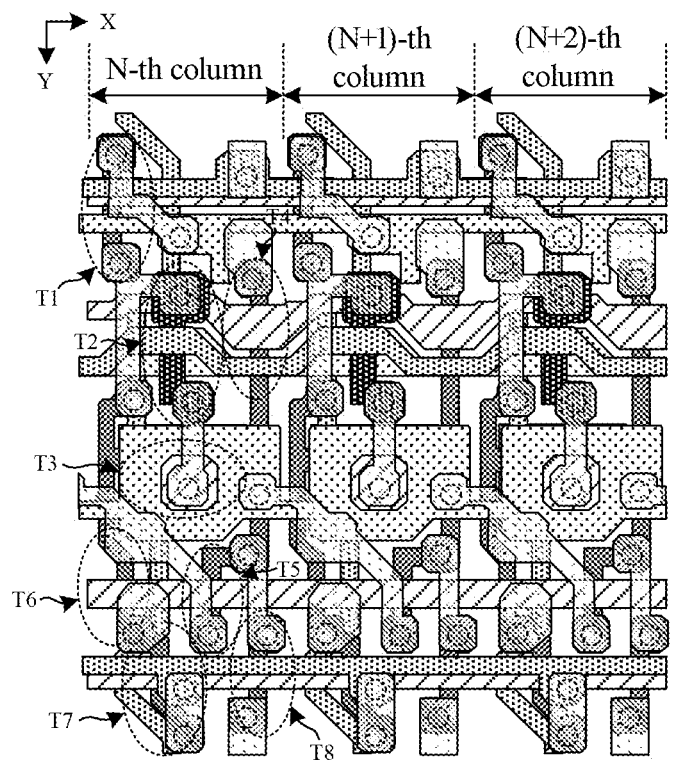
FIG. 13A and FIG. 13B are schematic diagrams of a display substrate after a pattern of a fourth conductive layer is formed according to the present disclosure.
Figure 13B:
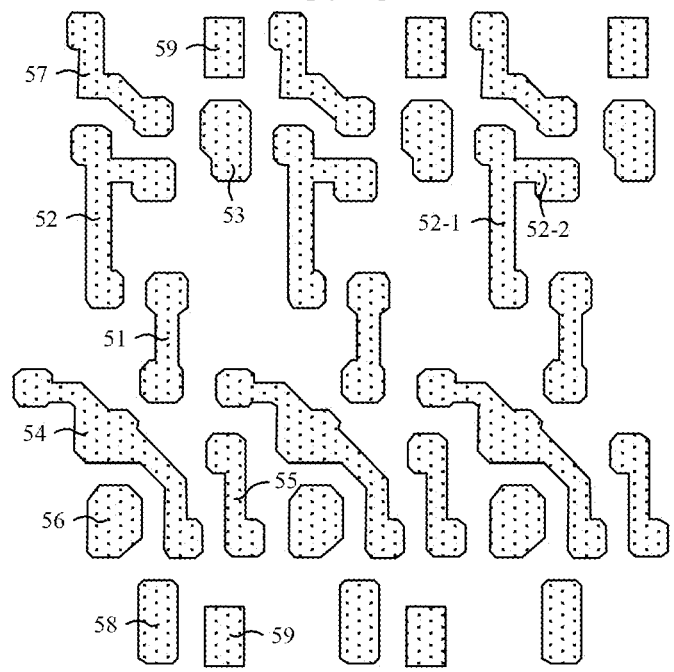

(18) Forming a pattern of a fourth conductive layer. In an exemplary implementation, forming the pattern of the fourth conductive layer may include: depositing a fourth conductive thin film on the base substrate on which the aforementioned patterns are formed, and patterning the fourth conductive thin film by a patterning process to form the fourth conductive layer arranged on the sixth insulation layer, as shown in FIG. 13A and FIG. 13B, FIG. 13B being a schematic planar diagram of the fourth conductive layer in FIG. 13A. In an exemplary implementation, the fourth conductive layer may be referred to as a first source drain metal (SD1) layer.

In an exemplary implementation, the fourth conductive layer of each circuit unit at least includes: a first connection electrode 51, a second connection electrode 52, a third connection electrode 53, a fourth connection electrode 54, a fifth connection electrode 55, a sixth connection electrode 56, a seventh connection electrode 57, an eighth connection electrode 58 and a ninth connection electrode 59.

In an exemplary embodiment, the first connection electrode 51 may be in a shape of a bending line in which a main portion extends along the second direction Y, a first terminal of the first connection electrode 51 is connected to the first region of the second active layer through the third via V3, and a second terminal of the first connection electrode 51, after extending along the second direction Y, is connected to the first electrode plate 26 through the thirteenth via V13. In an exemplary embodiment, because the first electrode plate 26 also serves as a gate electrode of the third transistor T3, the first connection electrode 51 enables the first electrode of the second transistor T2, the gate electrode of the third transistor T3 and the first electrode plate 26 to have the same potential and form the first node N1 of the pixel drive circuit.

In an exemplary embodiment, because the first region of the second active layer (the first electrode of the second transistor) is disposed at a side of the fourth scan signal line 24 close to the storage capacitor, and the second region of the second active layer (the second electrode of the second transistor) is disposed at a side of the fourth scan signal line 24 away from the storage capacitor, thus the first connection electrode 51 connecting the first region of the second active layer and the first electrode plate 26 has a small extension length, there is a large distance between the first connection electrode 51 and the data signal line formed subsequently, and an orthographic projection of the first connection electrode 51 on the base substrate does not overlap orthographic projections of the first scan signal line 21 and the fourth scan signal line 24 on the base substrate, which can effectively reduce the capacitance between the first node N1 of the pixel drive circuit and the data signal line and the scan signal line, avoid crosstalk to the maximum extent, and improve the display effect and display quality.

In an exemplary embodiment, the second active layer 12 and the first connection electrode 51 of the second transistor T2 may each be in a shape of a strip in which a main portion extends along the second direction Y, and an extension length of the first connection electrode 51 may be less than an extension length of the second active layer 12.

In an exemplary embodiment, the second connection electrode 52 may include a first sub-electrode 52-1 in a shape of a strip in which a main portion extends along the second direction Y and a second sub-electrode 52-2 in a shape of a strip in which a main portion extends along the first direction X. a first terminal of the first sub-electrode 52-1 is connected to the second region of the first active layer through the second via V2. a second terminal of the first sub-electrode 52-1, after extending along the second direction Y, is connected to the second region of the third active layer (also the first region of the sixth active layer) through the fifth via V5. A first terminal of the second sub-electrode 52-2 is connected to the first sub-electrode 52-1, a second terminal of the second sub-electrode 52-2, after extending in the first direction X toward the second region of the second active layer, is connected to the second region of the second active layer through the fourth via V4. In an exemplary embodiment, the second connection electrode 52 enables the second electrode of the first transistor T1, the second electrode of the second transistor T2, the second electrode of the third transistor T3, and the first electrode of the sixth transistor T6 to have the same potential, and form the third node N3 of the pixel drive circuit.

In an exemplary embodiment, an extension length of the first connection electrode 51 may be less than an extension length of the first sub-electrode 52-1.

In an exemplary embodiment, the third connection electrode 53 may be in a shape of a block (e.g., rectangular) and the third connection electrode 53 is connected to the first region of the fourth active layer through the sixth via V6. In an exemplary embodiment, the third connection electrode 53 may serve as the first electrode of the fourth transistor T4, and the third connection electrode 53 is configured to be connected with a data signal line formed subsequently.

In an exemplary embodiment, the fourth connection electrode 54 may be in a shape of a bending line in which a main portion extends along the second direction Y, a first terminal of the fourth connection electrode 54 is connected to the first region of the fifth active layer of the present circuit unit through the seventh via V7, and a second terminal of the fourth connection electrode 54, after extending in an opposite direction of the second direction Y, is connected to the second electrode plate 33 of the adjacent circuit unit through the fourteenth via V14. Because a plurality of second electrode plates 33 in one unit row are connected to each other, it is achieved that the first electrode of the fifth transistor T5 and the second electrode plate 33 of the storage capacitor in each circuit unit have the same potential.

In an exemplary embodiment, the fifth connection electrode 55 may be in a shape of bending line in which a main portion extends along the second direction Y, a first terminal of the fifth connection electrode 55 is connected to the second region of the fifth active layer through the eighth via V8, and a second terminal of the fifth connection electrode 55, after extending along the second direction Y, is connected to the second region of the eighth active layer through the twelfth via V12. In an exemplary embodiment, because the second region of the fifth active layer serves as the first region of the third active layer and the second region of the fourth active layer at the same time, the fifth connection electrode 55 enables the first electrode of the third transistor T3, the second electrode of the fourth transistor T4, the second electrode of the fifth transistor T5 and the second electrode of the eighth transistor T8 to have the same potential and form the second node N2 of the pixel drive circuit.

In an exemplary embodiment, the sixth connection electrode 56 may be in a shape of a block (e.g., a rectangle), and the sixth connection electrode 56 is connected to the second region of the sixth active layer (also the second region of the seventh active layer) through the ninth via V9. In an exemplary embodiment, the sixth connection electrode 56 may serve as the second electrode of the sixth transistor T6 and the second electrode of the seventh transistor T7 simultaneously, and the sixth connection electrode 56 is configured to be connected with an anode connection electrode formed subsequently.

In an exemplary embodiment, the seventh connection electrode 57 may be in a shape of bending line in which a main portion extends along the second direction Y, a first terminal of the seventh connection electrode 57 is connected to the first region of the first active layer through the first via V1, and a second terminal of the seventh connection electrode 57 is connected to the first initial connection block 31-1 through the fifteenth via V15. In an exemplary embodiment, the seventh connection electrode 57 may serve as the first electrode of the first transistor T1, and because the first initial connection block 31-1 is connected to the first initial signal line 31, the seventh connection electrode 57 enables the first initial signal transmitted by the first initial signal line 31 to be written to the first electrode of the first transistor T1.

In an exemplary embodiment, the eighth connection electrode 58 may be in a shape of a strip in which a main portion extends along the second direction Y, a first terminal of the eighth connection electrode 58 is connected to the first region of the seventh active layer through the tenth via V10, and a second terminal of the eighth connection electrode 58 is connected to the second initial connection block 42-1 through the sixteenth via V16. In an exemplary embodiment, the eighth connection electrode 58 may serve as the first electrode of the seventh transistor T7, and because the second initial connection block 42-1 is connected to the second initial signal line 42, the eighth connection electrode 58 enables the second initial signal transmitted by the second initial signal line 42 to be written to the first electrode of the seventh transistor T7.

In an exemplary embodiment, the ninth connection electrode 59 may be in a shape of a strip in which a main portion extends in the second direction Y, a first terminal of the ninth connection electrode 59 is connected to the first region of the eighth active layer of the present circuit unit through the eleventh via V11, and a second terminal of the ninth connection electrode 59 is connected to the third initial connection block 43-1 in the next unit row through the seventeenth via V17. The ninth connection electrode 59 may serve as the first electrode of the eighth transistor T8, and because the third initial connection block 43-1 is connected to the third initial signal line 43, the ninth connection electrode 59 enables the third initial signal transmitted by the third initial signal line 43 to be written to the first electrode of the eighth transistor T8.

In an exemplary embodiment, the positions and shapes of the fourth conductive layers of adjacent unit columns may be substantially the same.

Figure 14:
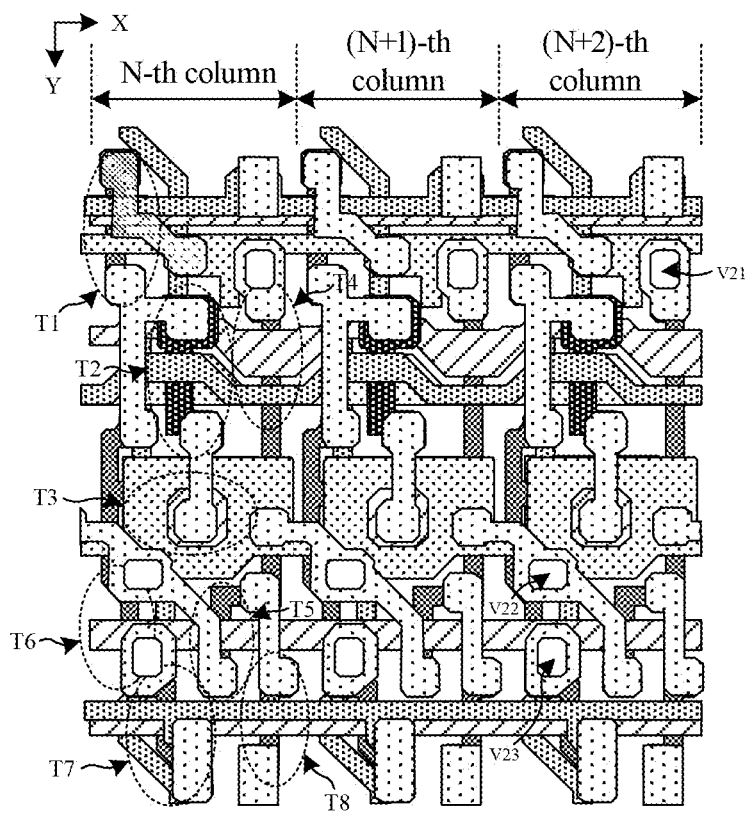
FIG. 14 is a schematic diagram of a display substrate after a pattern of a first planarization layer is formed according to the present disclosure.

(19) Forming a pattern of a first planarization layer. In an exemplary embodiment, forming a pattern of a first planarization layer may include: coating a first planarization thin film on the base substrate on which the aforementioned patterns are formed, patterning the first planarization thin film using a patterning process to form a first planarization layer covering the pattern of the fourth conductive layer, and the first planarization layer is provided with a plurality of vias, as shown in FIG. 14.

In an exemplary embodiment, the plurality of vias in each circuit unit at least includes a twenty-first via V21, a twenty-second via V22, and a twenty-third via V23.

In an exemplary embodiment, an orthographic projection of the twenty-first via V21 on the base substrate is located within a range of an orthographic projection of the third connection electrode 53 on the base substrate, the first planarization layer in the twenty-first via V21 is etched away to expose a surface of the third connection electrode 53, and the twenty-first via V21 is configured such that a data signal line formed subsequently is connected with the third connection electrode 53 through the via.

In an exemplary embodiment, an orthographic projection of the twenty-second via V22 on the base substrate is within a range of an orthographic projection of the fourth connection electrode 54 on the base substrate, the first planarization layer in the twenty-second via V22 is etched away to expose the surface of the fourth connection electrode 54, and the twenty-second via V22 is configured such that a subsequently formed power supply connection line is connected to the fourth connection electrode 54 through the via.

In an exemplary embodiment, an orthographic projection of the twenty-third via V23 on the base substrate is within a range of an orthographic projection of the sixth connection electrode 56 on the base substrate, the first planarization layer in the twenty-third via V23 is etched away to expose a surface of the sixth connection electrode 56, and the twenty-third via V23 is configured such that an anode connection electrode formed subsequently is connected with the sixth connection electrode 56 through the via.

In an exemplary embodiment, the positions and shapes of a plurality of vias on the first planarization layers of adjacent unit columns may be substantially the same.

Figure 15A:
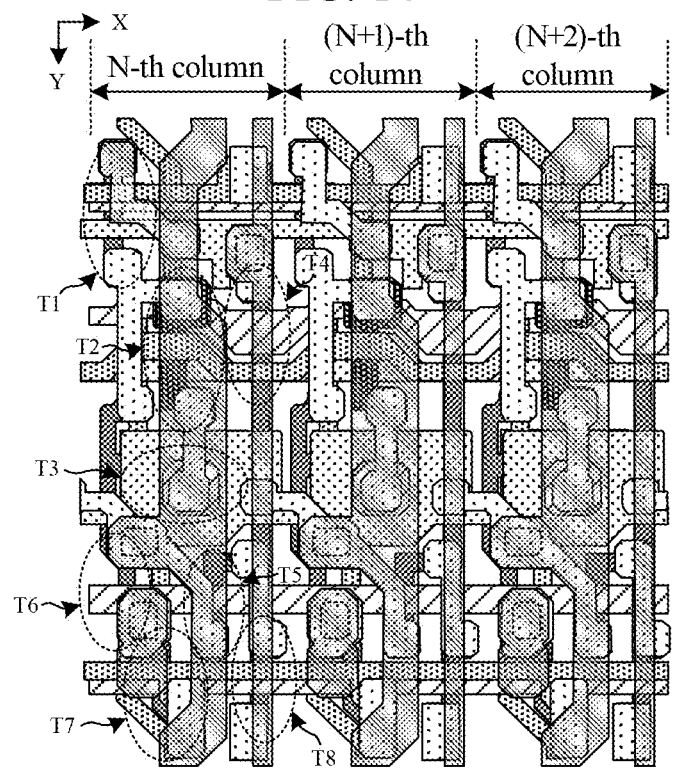
FIG. 15A and FIG. 15B are schematic diagrams of a display substrate after a pattern of a fifth conductive layer is formed according to the present disclosure.
Figure 15B:
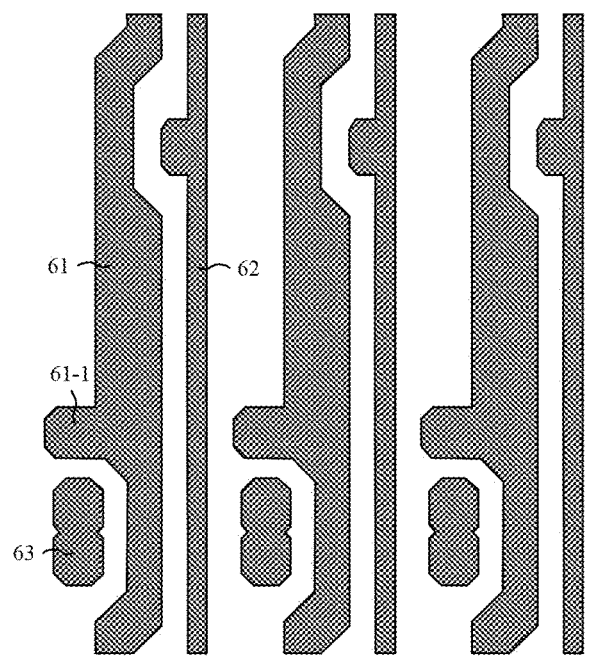

(20) Forming a pattern of a fifth conductive layer. In an exemplary embodiment, forming a fifth conductive layer may include: depositing a fifth conductive thin film on the base substrate on which the above-mentioned patterns are formed, patterning the fifth conductive thin film using a patterning process to form a fifth conductive layer disposed on the first planarization layer, as shown in FIG. 15A and FIG. 15B, and FIG. 15B is a schematic plan view of the fifth conductive layer in FIG. 15A. In an exemplary embodiment, the fifth conductive layer may be referred to as a second source-drain metal (SD2) layer.

In an exemplary embodiment, the fifth conductive layer of each circuit unit includes at least a first power supply line 61, a data signal line 62 and an anode connection electrode 63.

In an exemplary implementation, the first power supply line 61 may be in a shape of a straight line or a bending line in which a main portion extends in the second direction Y, and the first power supply line 61 is connected to the fourth connection electrode 54 through the twenty-second via V22. Because the fourth connection electrode 54 is connected to the first region of the fifth active layer and the second electrode plate 33 of the storage capacitor, respectively, it is achieved that the first power supply line 61 writes the first power supply signal to the fifth transistor T5 and the second electrode plate 33 of the storage capacitor.

In an exemplary embodiment, the first power supply lines 61 may be of bending lines with unequal widths, which may not only facilitate a layout of a pixel structure, but also reduce a parasitic capacitance between a first power supply line and a data signal line.

In an exemplary embodiment, the first power supply line 61 is connected with a power supply connection block 61-1, and the power supply connection block 61-1 is connected to the fourth connection electrode 54 through the twenty-second via V22.

In an exemplary embodiment, the data signal line 62 may be in a shape of a straight line or a bending line in which a main portion extends in the second direction Y, and the data signal line 62 is connected to the third connection electrode 53 through the twenty-first via V21. Because the third connection electrode 53 is connected with the first region of the fourth active layer through a via, the connection between the data signal line 62 and the first electrode of the fourth transistor T4 is achieved, and the data signal line 62 can write a data signal to the first electrode of the fourth transistor T4.

In an exemplary embodiment, the anode connection electrode 63 may be in a shape of a block (e.g., a rectangle), the anode connection electrode 63 is connected to the sixth connection electrode 56 through the twenty-third via V23, and the anode connection electrode 63 is configured to be connected to an anode formed subsequently. Because the sixth connection electrode 56 is connected to the second region of the sixth active layer and the second region of the seventh active layer through a via, the connection of the anode formed subsequently to the second electrode of the sixth transistor T6 and the second electrode of the seventh transistor T7 can be achieved, and the pixel drive circuit can drive the light emitting device to emit light.

In an exemplary embodiment, an orthographic projection of the first power supply line 61 on the base substrate at least partially overlaps an orthographic projection of the first connection electrode 51 on the base substrate, and the first power supply line 61 with a constant potential can effectively shield from the influence of the data voltage jump and other signals on the first node N1 in the pixel drive circuit, avoid the influence of the data voltage jump and other signals on the potential of the first node N1, and improve the driving performance of the pixel drive circuit.

In an exemplary embodiment, an orthographic projection of the first power supply line 61 on the base substrate may include an orthographic projection of the first connection electrode 51 on the base substrate.

In an exemplary embodiment, an orthographic projection of the first power supply line 61 on the base substrate at least partially overlaps an orthographic projection of the second active layer on the base substrate, so that the first power supply line 61 may shield the second active layer, may block light emitted by a light emitting device and light reflected by a film layer from irradiating the second transistor of oxide T2, may prevent the oxide transistor from characteristic drift due to illumination, thus improving electrical characteristics of the oxide transistor.

In an exemplary embodiment, an orthographic projection of the first power supply line 61 on the base substrate may include an orthographic projection of the second active layer on the base substrate.

In an exemplary embodiment, the positions and shapes of the fifth conductive layers of adjacent unit columns may be substantially the same.

Subsequently, a pattern of a second planarization layer covering the pattern of the fifth conductive layer is formed, and a plurality of anode vias are formed on the second planarization layer using a patterning process, the anode vias expose the surface of the anode connection electrode, and the anode vias are configured such that an anode formed subsequently is connected to the anode connection electrode through the vias.

So far, the drive circuit layer has been prepared on the base substrate. In a plane parallel to the display substrate, the drive circuit layer may include a plurality of circuit units, each of which may include a pixel drive circuit, and a first scan signal line, a second scan signal line, a third scan signal line, a fourth scan signal line, a light emitting signal line, a data signal line, a first power supply line, a first initial signal line, a second initial signal line, and a third initial signal line connected to the pixel drive circuit. In a plane perpendicular to the display substrate, the drive circuit layer may include a shielding layer, a first insulating layer, a first semiconductor layer, a second insulating layer, a first conductive layer, a third insulating layer, a second conductive layer, a fourth insulating layer, a second semiconductor layer, a fifth insulating layer, a third conductive layer, a sixth insulating layer, a fourth conductive layer, a first planarization layer, a fifth conductive layer and a second planarization layer arranged sequentially on the base substrate. The shielding layer may at least include shielding electrodes, the first semiconductor layer may at least include active layers of the first transistor, the third transistor to the eighth transistor, the first conductive layer may at least include the first scan signal line, the second scan signal line, the third scan signal line, the light emitting signal line and the first electrode of the storage capacitor, the second conductive layer may at least include the first initial signal line, the shielding line and the second electrode of the storage capacitor, the second semiconductor layer may at least include an active layer of the second transistor, the third conductive layer may at least include the second initial signal line, the third initial signal line and the fourth scan signal line, the fourth conductive layer may at least include a plurality of connection electrodes, and the fifth conductive layer may include at least the first power supply line, the data signal line, and the anode connection electrode.

In an exemplary implementation, the base substrate may be a flexible base substrate, or a rigid base substrate. The rigid base substrate may include, but is not limited to, one or more of glass and quartz. The flexible base substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible base substrate may include a first flexible material layer, a first inorganic material layer, a semiconductor layer, a second flexible material layer, and a second inorganic material layer which are stacked. Materials of the first flexible material layer and the second flexible material layer may be Polyimide (PI), Polyethylene Terephthalate (PET), or surface treated polymer soft film, etc., and materials of the first inorganic material layer and the second inorganic material layer may be Silicon Nitride (SiNx), Silicon Oxide (SiOx), or the like, for improving water and oxygen resistance of a base substrate. The first inorganic material layer and the second inorganic material layer may also be referred to as barrier layers, and the material of the semiconductor layer may be amorphous silicon (a-si).

In an exemplary embodiment, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the aforementioned metals, such as an Aluminum-Neodymium alloy (AlNd) or a Molybdenum-Niobium alloy (MoNb), and may be of a single-layer structure, or a multi-layer composite structure such as Mo/Cu/Mo. The first insulation layer, the second insulation layer, the third insulation layer, the fourth insulation layer, the fifth insulation layer, and the sixth insulation layer may be made of any one or more of Silicon Oxide (SiOx), Silicon Nitride (SiNx), and Silicon OxyNitride (SiON), and may be a single layer, a multi-layer, or a composite layer. The first planarization layer and the second planarization layer may be made of an organic material, such as resin.

In an exemplary embodiment, after preparation for the drive circuit layer is completed, a subsequent preparation process may include processes such as preparing a light emitting structure layer on the drive circuit layer and preparing an encapsulation structure layer on the light emitting structure layer. In an exemplary embodiment, the preparation process for the light emitting structure layer may include forming an anode conductive layer, which includes at least a plurality of anodes, and the plurality of anodes may be respectively connected to an anode connection electrode of a circuit unit where they are located through an anode via. A pixel definition layer covering the anode conductive layer is formed, a plurality of pixel openings exposing the anode are provided on the pixel definition layer, an organic light emitting layer is formed using an evaporation or inkjet printing process, and then a cathode is formed on the organic light emitting layer. Forming the encapsulation structure layer may include sequentially forming a first encapsulation layer, a second encapsulation layer and a third encapsulation layer. The first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting structure layer.

With the continuous development of display technology, the resolution of display apparatus (Pixels Per Inch, referred to as PPI) is continuously improved, the size of the pixel unit continues to decrease, and the space for arranging the pixel driver circuit continues to be compressed. With the reduction the size of the pixel unit, the distance between various nodes and the distance between various nodes and signal lines in the pixel drive circuit decrease, this makes the inter-signal capacitance increased.

In a display substrate, the capacitance between a first node N1 of a pixel drive circuit and a data signal line is large, about 0.157 (fF), and there is an issue of crosstalk, which may even lead to deterioration of the display effect. Research shows that, the display substrate has the problem of large capacitance, which is caused by the irrational design of the connection position between nodes. In the pixel drive circuit structure of the display substrate, because the first electrode of the oxide compensation transistor is provided at a side of the fourth scan signal line away from the storage capacitor, and the second electrode of the oxide compensation transistor is provided at a side of the fourth scan signal line close to the storage capacitor, thus the first connection electrode connecting the first electrode of the oxide compensation transistor and the first electrode plate of the storage capacitor is required to avoid the second electrode of the oxide compensation transistor by bending a line. The bent line structure not only increases an extension length of the first connection electrode, but also reduces the distance between the first connection electrode and the data signal line, thereby resulting in a larger capacitance between the first node N1 of the pixel drive circuit and the data signal line. In addition, because the first electrode of the oxide compensation transistor is provided at a side of the fourth scan signal line away from the storage capacitor, the first connection electrode is required to cross the fourth scan signal line, resulting in a large capacitance between the first connection electrode and the fourth scan signal line, about 3.324 (fF), which increases power consumption.

The display substrate according to an embodiment of the present disclosure effectively reduces the capacitance between the first node N1 of the pixel drive circuit and the data signal line by adjusting the writing path of the data signal. In the pixel drive circuit structure of the present disclosure, the first electrode of the oxide second transistor (i.e., the compensation transistor) is provided at a side of the fourth scan signal line close to the storage capacitor, the first electrode of the second transistor is connected to the first electrode plate of the storage capacitor (i.e., the gate electrode of the drive transistor) through the first connection electrode (i.e., the first node N1), the second electrode of the second transistor is provided at a side of the fourth scan signal line away from the storage capacitor, the second electrode of the second transistor is connected to the second electrode of the drive transistor through the second connection electrode, and the adjusted writing path of the data signal is as follows: the data signal provided by the data signal line, after passing through the third transistor, first reaches the second electrode of the second transistor via the second connection electrode (the SD1 layer) along an opposite direction of the second direction Y (from bottom to top), and then passes through the second transistor along the second direction Y (from top to bottom), and then reaches the first electrode plate of the storage capacitor (that is, the gate electrode of the third transistor) through the first connection electrode (the SD1 layer) along the second direction Y (from top to bottom). In this way, not only an extension length of the first connection electrode is effectively shortened, but also the bent line structure is avoided, and the distance between the first connection electrode and the data signal line is increased. Because the capacitance between the first connection electrode and the data signal line is positively correlated with the extension length of the first connection electrode and positively correlated with the distance between the first connection electrode and the data signal line, the structure of the present disclosure effectively reduces the capacitance between the first node N1 of the pixel drive circuit and the data signal line. In the present embodiment, the capacitance between the first node N1 and the data signal line is only about 0.010 (fF). Compared with the prior structure, the capacitance is reduced by more than 90%, which avoids the crosstalk to the maximum extent and improves the display effect and display quality.

The present disclosure effectively reduces the capacitance between the first node N1 and the fourth scan signal line by providing the first electrode of the oxide second transistor at a side of the fourth scan signal line close to the storage capacitor, so that an orthographic projection of the first connection electrode on the base substrate and an orthographic projection of the fourth scan signal line on the base substrate do not overlap. Research shows that, after the data signal is written, the fourth scan signal line will undergo a voltage jump from a high voltage to a low voltage to turn off the compensation transistor, and the voltage jump of the fourth scan signal line will pull down the voltage of the first node N1 through capacitive coupling, so the setting of the data signal of the black picture (L0) needs to take into account the influence of the capacitive coupling. In the present embodiment, the capacitance between the first node N1 and the scan signal line is only about 1.634 (fF), the capacitance is reduced by about 50% compared with the prior structure, therefore, the setting of the data signal of the black picture does not need to take into account the influence of the capacitance coupling, thereby decreasing the black picture voltage, effectively reducing power consumption, further avoiding crosstalk and improving the display effect and display quality.

The present disclosure, by setting the first power supply line to cover the first connection electrode, can effectively shield the influence of the data voltage jump and other signals on the first node in the pixel drive circuit, avoid the influence of the data voltage jump and other signals on the potential of the first node, and effectively avoid the deterioration of crosstalk. By setting the first power supply line to cover the second active layer, the present disclosure can effectively block light emitted by a light emitting device and light reflected by a film layer from irradiating the oxide transistor, may prevent the oxide transistor from characteristic drift due to illumination, and improves the electrical characteristics of the oxide transistor. The preparation process in the present disclosure may be compatible well with an existing preparation process, is simple in process implementation, is easy to implement, and has a high production efficiency, a low production cost, and a high yield.

Figure 16:
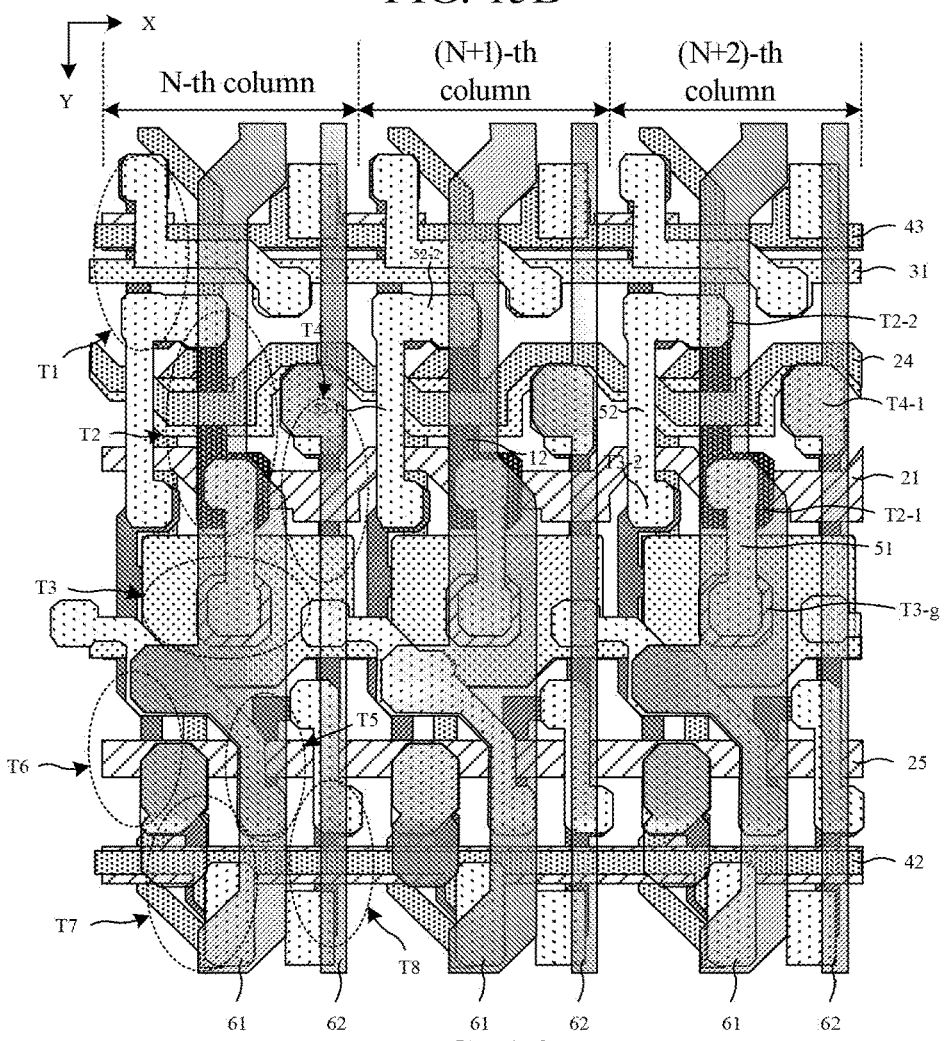
FIG. 16 illustrates a schematic diagram of a planar structure of another display substrate according to an exemplary embodiment of the present disclosure.

FIG. 16 is a schematic diagram of a planar structure of another display substrate according to an exemplary embodiment of the present disclosure. In an exemplary embodiment, the body structure of the display substrate of the present embodiment is substantially the same as that of the foregoing embodiment, except that in the present embodiment, the fourth scan signal line 24 may be located at a side of the first scan signal line 21 away from the gate electrode T3-g of the third transistor, and the first electrode T4-1 of the fourth transistor may be disposed at a side of the fourth scan signal line 24 close to the gate electrode T3-g of the third transistor.

In an exemplary embodiment, the first connection electrode 51 may be located at a side of the fourth scan signal line 24 close to the gate electrode T3-g of the third transistor, and an orthographic projection of the first connection electrode 51 on the plane of the display substrate and an orthographic projection of the fourth scan signal line 24 on the plane of the display substrate do not overlap.

In an exemplary embodiment, an orthographic projection of the first connection electrode 51 on the plane of the display substrate at least partially overlaps an orthographic projection of the first scan signal line 21 on the plane of the display substrate.

In an exemplary embodiment, taking three circuit units (one unit row and three unit columns) as an example, the preparation process for the display substrate of the present embodiment may include the following operations.

Figure 17:
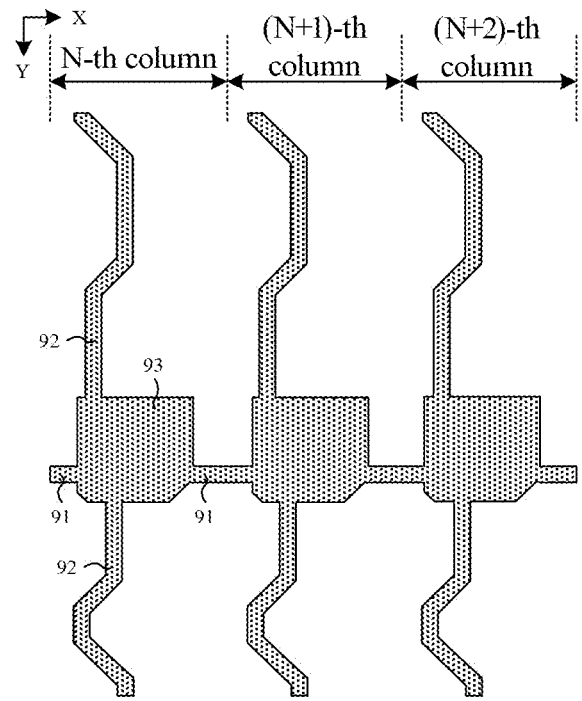
FIG. 17 is a schematic diagram of another display substrate after a pattern of a shielding layer is formed according to the present disclosure.

(21) A pattern of a shielding layer is formed. In an exemplary embodiment, the process of forming the pattern of the shielding layer and the structure of the shielding layer are substantially the same as those of the foregoing embodiments, as shown in FIG. 17.

Figure 18A:
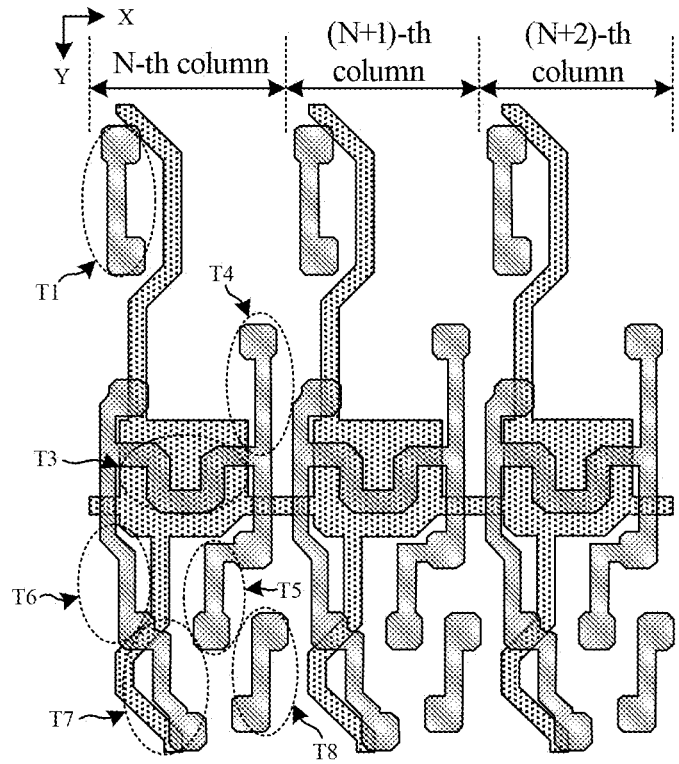
FIG. 18A and FIG. 18B are schematic diagrams of another display substrate after a pattern of a first semiconductor layer is formed according to the present disclosure.
Figure 18B:
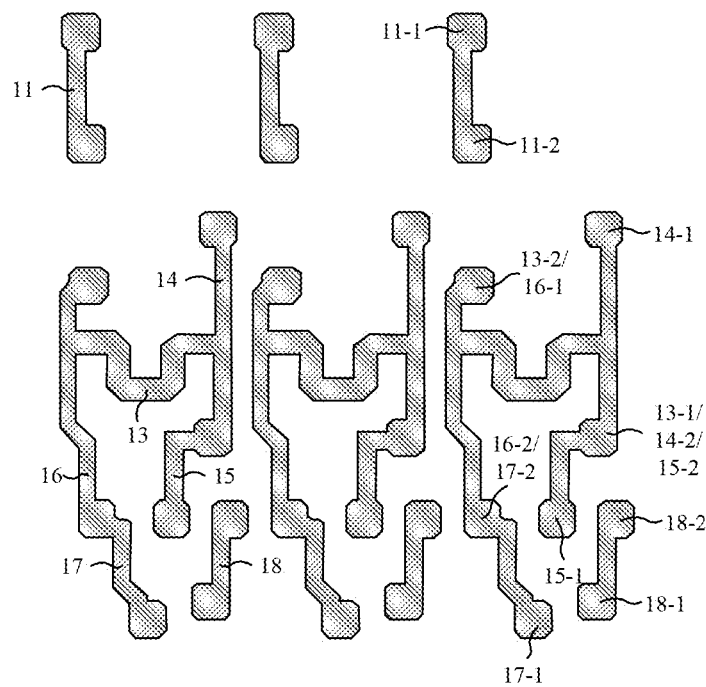

(22) Forming a pattern of a first semiconductor layer. In an exemplary embodiment, the process of forming the first semiconductor layer and the structure of the first semiconductor layer are substantially the same as those of the foregoing embodiments, except that an extension length of the fourth active layer 14 of the present embodiment is shorter, i.e., the distance between the first region of the fourth active layer and the second region of the first active layer in the second direction Y is larger, as shown in FIGS. 18A and 18B, FIG. 18B is a schematic plan view of the first semiconductor layer in FIG. 18A.

Figure 19A:
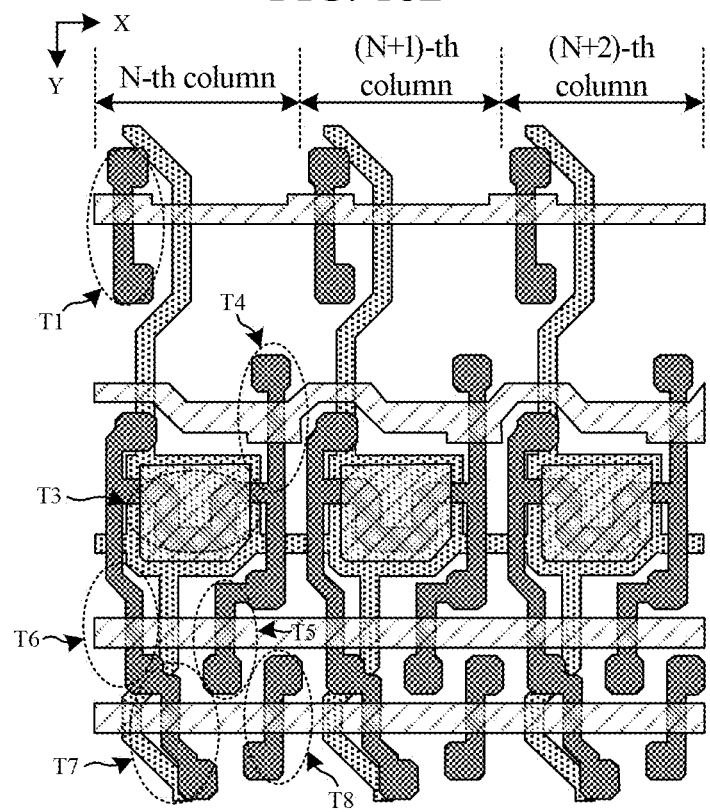
FIG. 19A and FIG. 19B are schematic diagrams of another display substrate after a pattern of a first conductive layer is formed according to the present disclosure.
Figure 19B:
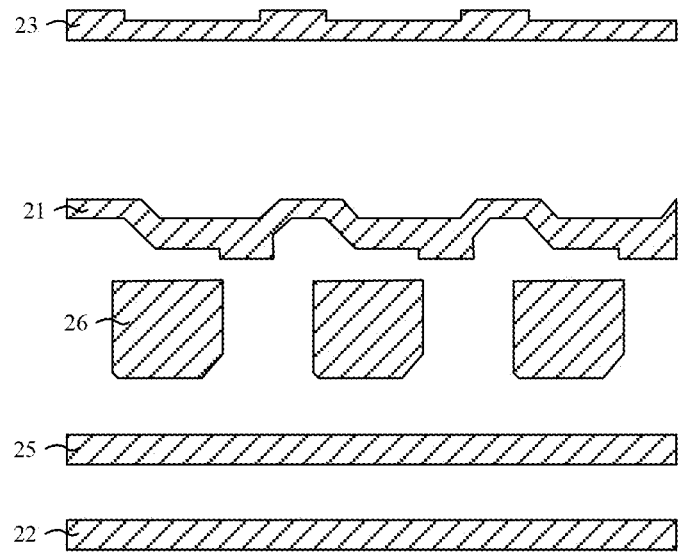

(23) A pattern of a first conductive layer is formed. In an exemplary embodiment, the process of forming the first conductive layer and the structure of the first conductive layer are substantially the same as those of the foregoing embodiments, except that the spacing between the first scan signal line 21 and the first electrode plate 26 in the present embodiment is small, as shown in FIGS. 19A and 19B, FIG. 19B is a schematic plan view of the first conductive layer in FIG. 19A.

Figure 20A:
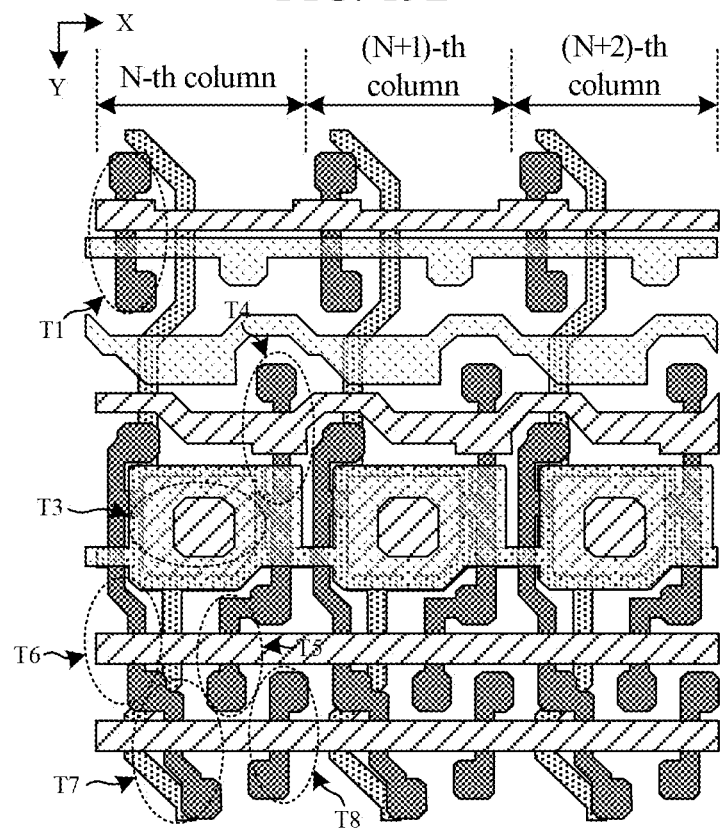
FIG. 20A and FIG. 20B are schematic diagrams of another display substrate after a pattern of a second conductive layer is formed according to the present disclosure.
Figure 20B:
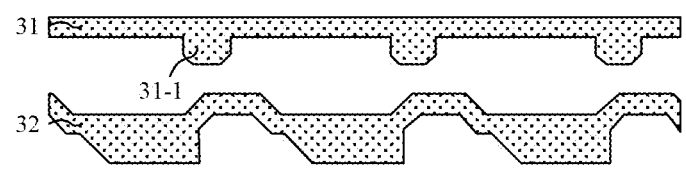
Figure 20B:
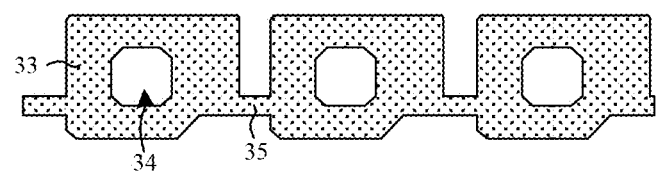

(24) A pattern of a second conductive layer is formed. In an exemplary embodiment, the process of forming the second conductive layer and the structure of the second conductive layer are substantially the same as those of the foregoing embodiments, except that the shielding line 32 of the present embodiment is located at a side of the first scan signal line 21 away from the first electrode plate 26, as shown in FIGS. 20A and 20B, FIG. 20B is a schematic plan view of the second conductive layer in FIG. 20A.

In an exemplary embodiment, the first scan signal line 21 of the foregoing embodiment is located between the first initial signal line 31 and the shielding line 32, and the shielding line 32 of the present embodiment is located between the first initial signal line 31 and the first scan signal line 21, that is, the positions of the first scan signal line 21 and the shielding line 32 are interchanged in the present embodiment.

Figure 21A:
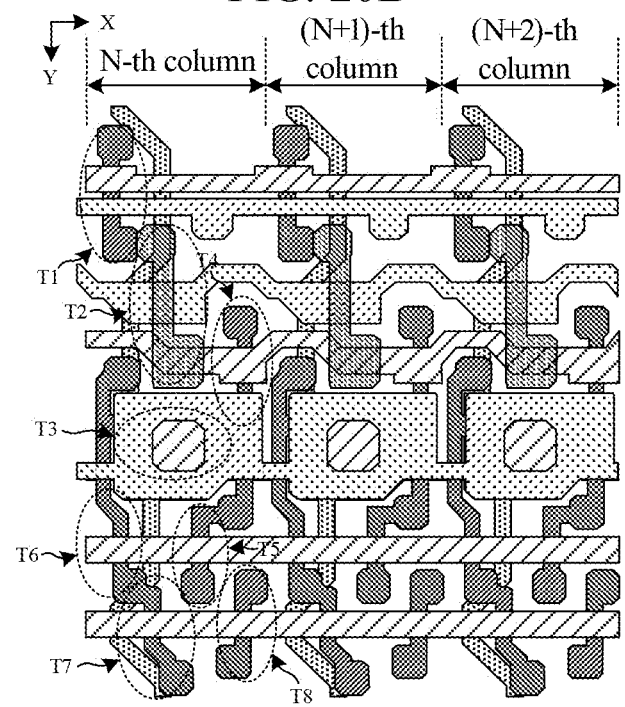
FIG. 21A and FIG. 21B are schematic diagrams of another display substrate after a pattern of a second semiconductor layer is formed according to the present disclosure.
Figure 21B:
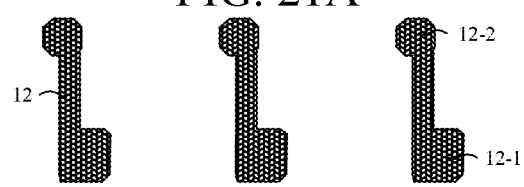

(25) Forming a pattern of a second semiconductor layer. In an exemplary embodiment, the process of forming the second semiconductor layer and the structure of the second semiconductor layer are substantially the same as those of the foregoing embodiments, as shown in FIGS. 21A and 21B, FIG. 21B is a schematic plan view of the second semiconductor layer in FIG. 21A.

In an exemplary embodiment, an orthographic projection of the second region of the second active layer on the base substrate at least partially overlaps an orthographic projection of the first scan signal line 21 on the base substrate in the foregoing embodiment, and an orthographic projection of the first region of the second active layer on the base substrate at least partially overlaps an orthographic projection of the first scan signal line 21 on the base substrate in the present embodiment.

Figure 22A:
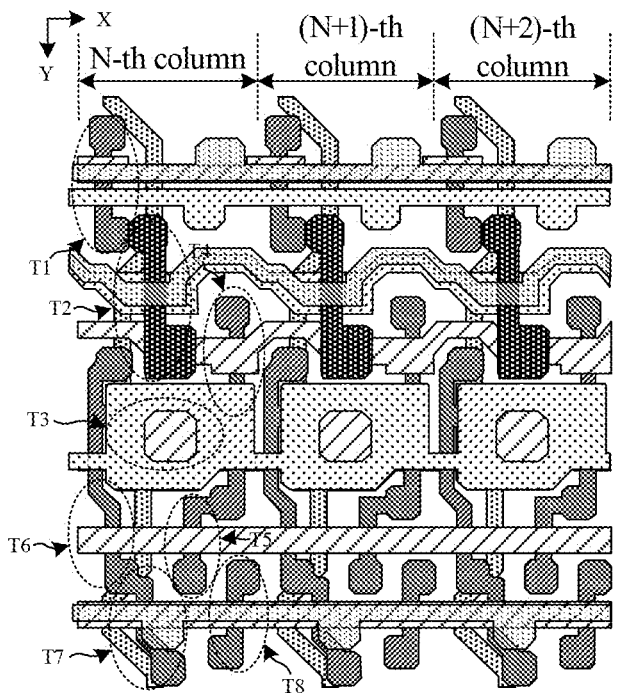
FIG. 22A and FIG. 22B are schematic diagrams of another display substrate after a pattern of a third conductive layer is formed according to the present disclosure.
Figure 22B:
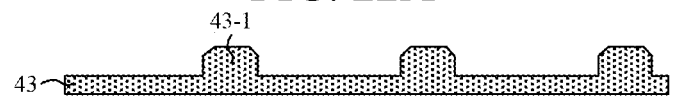
Figure 22B:
Figure 22B:
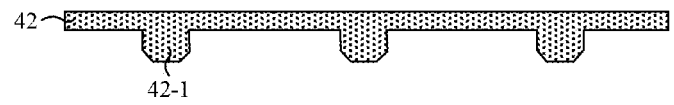

(26) Forming a pattern of a third conductive layer. In an exemplary embodiment, the process of forming the third conductive layer and the structure of the third conductive layer are substantially the same as those of the foregoing embodiments, the fourth scan signal line 24 is located at a side of the first scan signal line 21 away from the first electrode plate 26, and an orthographic projection of the fourth scan signal line 24 on the base substrate at least partially overlaps an orthographic projection of the shielding line 32 on the base substrate, as shown in FIGS. 22A and 22B, FIG. 22B is a schematic plan view of the third conductive layer in FIG. 22A.

In an exemplary embodiment, the first scan signal line 21 of the foregoing embodiment is located between the first initial signal line 31 and the fourth scan signal line 24, and the fourth scan signal line 24 of the present embodiment is located between the first initial signal line 31 and the first scan signal line 21, that is, the positions of the first scan signal line 21 and the fourth scan signal line 24 are interchanged in the present embodiment.

In an exemplary embodiment, the first region of the fourth active layer (the first electrode of the fourth transistor T4) may be located at a side of the fourth scan signal line 24 close to the storage capacitor.

Figure 23:
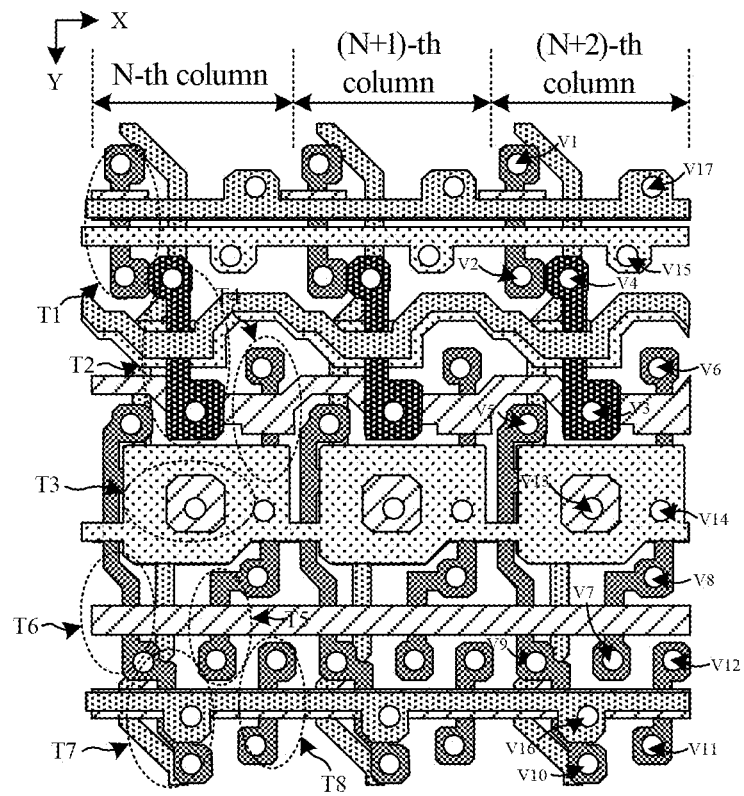
FIG. 23 is a schematic diagram of another display substrate after a pattern of a sixth insulating layer is formed according to the present disclosure.

(27) Forming a pattern of a sixth insulation layer. In an exemplary embodiment, the process of forming the sixth insulating layer and the structure of the plurality of vias are substantially the same as those of the foregoing embodiment, as shown in FIG. 23.

Figure 24A:
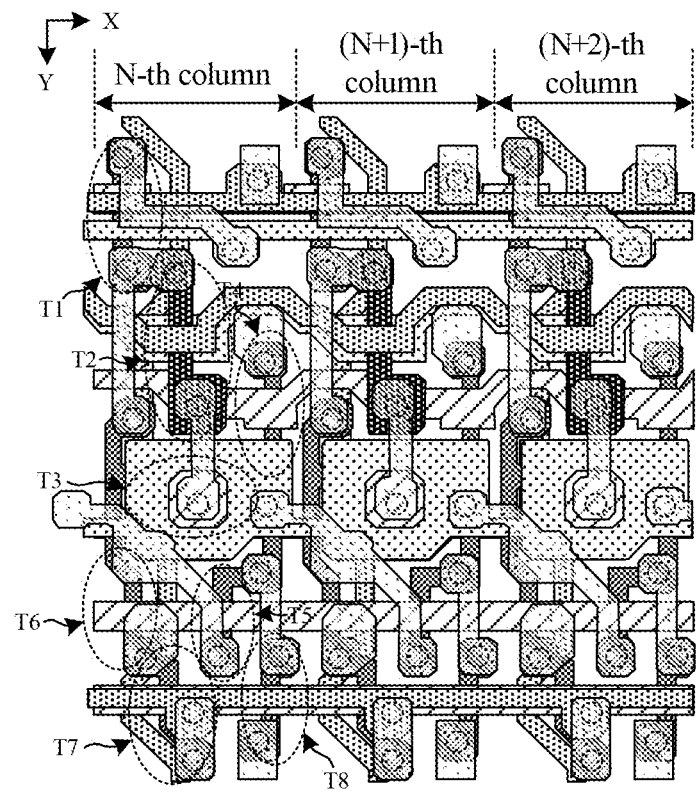
FIG. 24A and FIG. 24B are schematic diagrams of another display substrate after a pattern of a fourth conductive layer is formed according to the present disclosure.
Figure 24B:
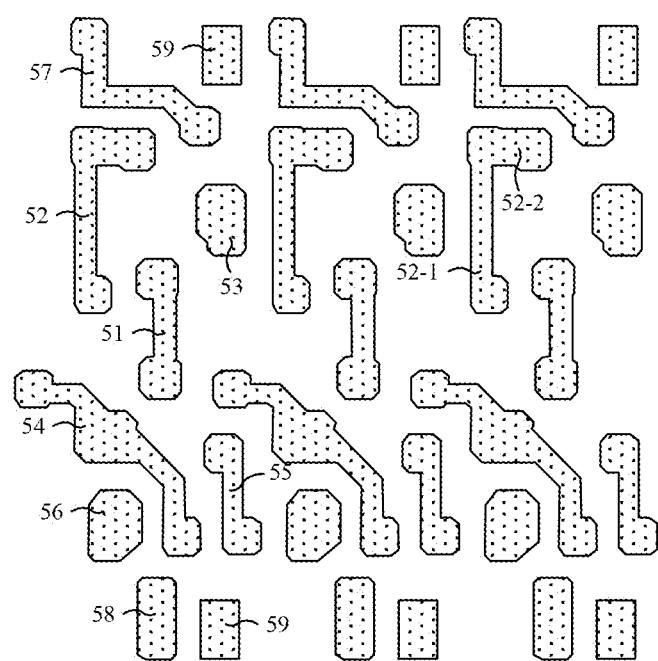

(28) Forming a pattern of a fourth conductive layer. In an exemplary embodiment, the process of forming the fourth conductive layer and the structure of the fourth conductive layer are substantially the same as those of the foregoing embodiments, except that the shape of the second connection electrode 52 of the present embodiment is slightly changed, as shown in FIGS. 24A and 24B, FIG. 24B is a schematic plan view of the fourth conductive layer in FIG. 24A.

In an exemplary embodiment, because the first region of the second active layer (the first electrode of the second transistor) is disposed at a side of the fourth scan signal line 24 close to the storage capacitor, and the second region of the second active layer (the second electrode of the second transistor) is disposed at a side of the fourth scan signal line 24 away from the storage capacitor, the first connection electrode 51 connecting the first region of the second active layer and the first electrode plate 26 has a small extension length, there is a large distance between the first connection electrode 51 and a data signal line formed subsequently, and an orthographic projection of the first connection electrode 51 on the base substrate and an orthographic projection of the fourth scan signal line 24 on the base substrate are not overlapped, which can effectively reduce the capacitance between the first node N1 of the pixel drive circuit and the data signal line, can effectively reduce the capacitance between the first node N1 of the pixel drive circuit and the fourth scan signal line, minimize the crosstalk and improve the display effect and display quality.

(29) A pattern of A first planarization layer and a pattern of a fifth conductive layer are sequentially formed. In an exemplary embodiment, the process and structure of forming the first planarization layer and the fifth conductive layer are substantially the same as those of the foregoing embodiments, as shown in FIG. 16.

Subsequently, a pattern of a second planarization layer covering the pattern of the fifth conductive layer is formed, and a drive circuit layer is prepared on the base substrate. After preparation of the driver circuit layer is completed, a subsequent preparation process may include processes such as preparing a light emitting structure layer on the driver circuit layer and preparing a encapsulation structure layer on the light emitting structure layer, which will not be repeated here.

The display substrate according to an embodiment of the present disclosure also effectively reduces the capacitance between the first node N1 of the pixel drive circuit and the data signal line by adjusting the writing path of the data signal. The capacitance between the first node N1 and the data signal line in present embodiment is only about 0.058 (fF), and the capacitance is reduced by about 65% compared with the prior structure, thus avoiding crosstalk and improving the display effect and display quality.

In present embodiment, an orthographic projection of the first connection electrode on the base substrate and an orthographic projection of the fourth scan signal line on the base substrate do not overlap, thus also effectively reducing the capacitance between the first connection electrode and the fourth scan signal line. Although an orthographic projection of the first connection electrode on the base substrate and an orthographic projection of the first scan signal line on the base substrate overlap at least partially in present embodiment, the capacitance between the first connection electrode and the scan signal line is only about 1.367 (fF). Compared with the prior art structure, the capacitance is reduced by about 60%, which can effectively reduce power consumption, further avoid crosstalk and improve display effect and display quality.

The aforementioned structure shown in the present disclosure and the preparation process thereof are merely exemplary description. In an exemplary embodiment, corresponding structures may be changed and patterning processes may be added or reduced according to actual needs, which is not limited here in the present disclosure.

In an exemplary embodiment, the display substrate of the present disclosure may be applied to another display apparatus having a pixel drive circuit, such as quantum dot display, which is not limited in the present disclosure.

The present disclosure further provides a preparation method for a display substrate, for preparing the display substrate according to the foregoing embodiments. In an exemplary embodiment, the display substrate includes a plurality of circuit units, and the preparation method may include following operations.

Forming a pixel drive circuit in at least one circuit unit, the pixel drive circuit includes at least a compensation transistor of oxide and a drive transistor of polysilicon, a gate electrode of the compensation transistor is connected to a compensation scan signal line configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode.

Although embodiments disclosed in the present disclosure are as above, it should be noted that the above embodiments are exemplary only rather than restrictive. Therefore, the present disclosure is not limited to what is specifically shown and described herein. Various modifications, substitutions or omissions may be made in forms and details of implementation without departing from the scope of the present disclosure.

The invention claimed is:

1. A display substrate, comprising a plurality of circuit units, wherein:
at least one circuit unit comprises a pixel drive circuit, the pixel drive circuit comprises at least a compensation transistor of oxide and a drive transistor of polysilicon, a gate electrode of the compensation transistor is connected to a compensation scan signal line, the compensation scan signal line is configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode; and
an orthographic projection of the first connection electrode on a plane of the display substrate and an orthographic projection of the compensation scan signal line on the plane of the display substrate are not overlapped.

2. The display substrate according to claim 1, wherein the compensation transistor comprises at least a compensation active layer, and the first connection electrode and the compensation active layer are both in a shape of a strip extending toward a direction of the drive transistor, and an extension length of the first connection electrode is less than an extension length of the compensation active layer.

3. The display substrate according to claim 2, wherein the pixel drive circuit further comprises a data writing transistor of polysilicon, a gate electrode of the data writing transistor is connected to a first scan signal line, a first electrode of the data writing transistor is connected to a data signal line, and a second electrode of the data writing transistor is connected to a first electrode of the drive transistor; the first electrode of the data writing transistor is disposed on a side of the compensation scan signal line away from the drive transistor, alternatively, the first electrode of the data writing transistor is disposed on a side of the compensation scan signal line close to the drive transistor.

4. The display substrate according to claim 1, wherein the second connection electrode comprises at least a first sub-electrode and a second sub-electrode, a first terminal of the first sub-electrode is connected to the second electrode of the drive transistor, a second terminal of the first sub-electrode extends toward a direction away from the drive transistor, a first terminal of the second sub-electrode is connected to the first sub-electrode, a second terminal of the second sub-electrode, after extending toward a direction of the compensation transistor, is connected to a second electrode of the compensation transistor, the first connection electrode is in a shape of a strip extending toward a direction of the drive transistor, and an extension length of the first sub-electrode is less than an extension length of the first sub-electrode.

5. The display substrate according to claim 4, wherein the pixel drive circuit further comprises a data writing transistor of polysilicon, a gate electrode of the data writing transistor is connected to a first scan signal line, a first electrode of the data writing transistor is connected to a data signal line, and a second electrode of the data writing transistor is connected to a first electrode of the drive transistor; the first electrode of the data writing transistor is disposed on a side of the compensation scan signal line away from the drive transistor, alternatively, the first electrode of the data writing transistor is disposed on a side of the compensation scan signal line close to the drive transistor.

6. The display substrate according to claim 1, wherein the at least one circuit unit further comprises a first power supply line connected to the pixel drive circuit, the first power supply line is configured to provide a first power supply signal to the pixel drive circuit, an orthographic projection of the first power supply line on the plane of the display substrate is at least partially overlapped with an orthographic projection of the first connection electrode on the plane of the display substrate.

7. The display substrate according to claim 6, wherein the compensation transistor comprises at least a compensation active layer, and the orthographic projection of the first power supply line on the plane of the display substrate is at least partially overlapped with an orthographic projection of the compensation active layer on the plane of the display substrate.

8. The display substrate according to claim 6, wherein the pixel drive circuit further comprises a data writing transistor of polysilicon, a gate electrode of the data writing transistor is connected to a first scan signal line, a first electrode of the data writing transistor is connected to a data signal line, and a second electrode of the data writing transistor is connected to a first electrode of the drive transistor; the first electrode of the data writing transistor is disposed on a side of the compensation scan signal line away from the drive transistor, alternatively, the first electrode of the data writing transistor is disposed on a side of the compensation scan signal line close to the drive transistor.

9. The display substrate according to claim 1, wherein the pixel drive circuit further comprises a data writing transistor of polysilicon, a gate electrode of the data writing transistor is connected to a first scan signal line, a first electrode of the data writing transistor is connected to a data signal line, and a second electrode of the data writing transistor is connected to a first electrode of the drive transistor; the first electrode of the data writing transistor is disposed on a side of the compensation scan signal line away from the drive transistor, alternatively, the first electrode of the data writing transistor is disposed on a side of the compensation scan signal line close to the drive transistor.

10. The display substrate according to claim 9, wherein the first scan signal line is disposed on a side of the compensation scan signal line away from the drive transistor.

11. The display substrate according to claim 10, wherein an orthographic projection of the first connection electrode on the plane of the display substrate and an orthographic projection of the first scan signal line on the plane of the display substrate are not overlapped.

12. The display substrate according to claim 9, wherein the compensation scan signal line is disposed on a side of the first scan signal line away from the drive transistor.

13. The display substrate according to claim 12, wherein an orthographic projection of the first connection electrode on the plane of the display substrate is at least partially overlapped with an orthographic projection of the first scan signal line on the plane of the display substrate.

14. The display substrate according to claim 9, wherein: the pixel drive circuit further comprises a first initialization transistor of polysilicon and a second initialization transistor of polysilicon; a gate electrode of the first initialization transistor is connected to a third scan signal line, a first electrode of the first initialization transistor is connected to a first initial signal line, and a second electrode of the first initialization transistor is connected to a second electrode of the drive transistor; a gate electrode of the second initialization transistor is connected with a second scan signal line, a first electrode of the second initialization transistor is connected with a second initial signal line, and a second electrode of the second initialization transistor is connected with an anode of a light emitting device; an orthographic projection of the second initial signal line on the plane of the display substrate is at least partially overlapped with an orthographic projection of the second scan signal line on the plane of the display substrate.

15. The display substrate according to claim 14, wherein the pixel drive circuit further comprises a third initialization transistor of polysilicon, a gate electrode of the third initialization transistor is connected to the second scan signal line, a first electrode of the third initialization transistor is connected to a third initial signal line, and a second electrode of the third initialization transistor is connected to the first electrode of the drive transistor; an orthographic projection of the third initial signal line on the plane of the display substrate is at least partially overlapped with an orthographic projection of the third scan signal line on the plane of the display substrate.

16. The display substrate according to claim 15, wherein on a plane perpendicular to the display substrate, the display substrate comprises a plurality of conductive layers sequentially disposed on a base substrate, the first initial signal line and the second initial signal line are disposed in different conductive layers, and the second initial signal line and the third initial signal line are disposed in a same conductive layer.

17. A display apparatus, comprising the display substrate according to claim 1.

18. A preparation method for a display substrate comprising a plurality of circuit units, the method comprising:
forming a pixel drive circuit in at least one circuit unit, wherein the pixel drive circuit comprises at least a compensation transistor of oxide and a drive transistor of polysilicon, a gate electrode of the compensation transistor is connected to a compensation scan signal line configured to control the turn-on and turn-off of the compensation transistor; a first electrode of the compensation transistor is disposed on a side of the compensation scan signal line close to the drive transistor and connected to a gate electrode of the drive transistor through a first connection electrode, and a second electrode of the compensation transistor is disposed on a side of the compensation scan signal line away from the drive transistor and connected to a second electrode of the drive transistor through a second connection electrode,
wherein an orthographic projection of the first connection electrode on a plane of the display substrate and an orthographic projection of the compensation scan signal line on the plane of the display substrate are not overlapped.

* * * * *